United States Patent
Kim et al.

(10) Patent No.: US 12,224,262 B2
(45) Date of Patent: Feb. 11, 2025

(54) SUBSTRATE BONDING APPARATUS AND METHOD OF MANUFACTURING SEMICONDUCTOR DEVICE BY USING THE SAME

(71) Applicant: SAMSUNG ELECTRONICS CO., LTD., Suwon-si (KR)

(72) Inventors: Taeyeong Kim, Suwon-si (KR); Ilyoung Han, Suwon-si (KR); Hoechul Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/638,947

(22) Filed: Apr. 18, 2024

(65) Prior Publication Data
US 2024/0266317 A1   Aug. 8, 2024

Related U.S. Application Data

(63) Continuation of application No. 16/933,055, filed on Jul. 20, 2020, now Pat. No. 11,990,444.

(30) Foreign Application Priority Data

Aug. 20, 2019   (KR) ........................ 10-2019-0101873

(51) Int. Cl.
*H01L 23/00*   (2006.01)

(52) U.S. Cl.
CPC .............. *H01L 24/74* (2013.01); *H01L 24/16* (2013.01); *H01L 24/80* (2013.01); *H01L 23/00* (2013.01);
(Continued)

(58) Field of Classification Search
None
See application file for complete search history.

(56) References Cited

U.S. PATENT DOCUMENTS

| 5,602,058 A | 2/1997 | Ooizumi et al. |
| 5,870,271 A | 2/1999 | Herchen |
| (Continued) | | |

FOREIGN PATENT DOCUMENTS

| CN | 105047589 | 11/2015 |
| CN | 106409704 | 2/2017 |
| (Continued) | | |

OTHER PUBLICATIONS

Office Action in Chinese Appln. No. 202010488372.9, mailed on Jul. 18, 2024, 15 pages (with English translation).
(Continued)

*Primary Examiner* — Linda L Gray
(74) *Attorney, Agent, or Firm* — Fish & Richardson P.C.

(57) ABSTRACT

A substrate bonding method and apparatus are described. The substrate bonding apparatus is used to bond a first substrate to a second substrate. The bonding apparatus includes a first bonding chuck configured to hold the first substrate on a first surface of the first bonding chuck; a second bonding chuck configured to hold the second substrate on a second surface of the second bonding chuck, the second surface facing the first surface of the first bonding chuck; a seal arranged between the first bonding chuck and the second bonding chuck and adjacent to at least one edge of the first substrate and at least one edge of the second substrate; and a process gas supply device configured to supply a process gas to a bonding space surrounded by the seal.

10 Claims, 17 Drawing Sheets

(52) U.S. Cl.
CPC ............... *H01L 2224/08145* (2013.01); *H01L 2224/80091* (2013.01); *H01L 2224/80095* (2013.01); *H01L 2224/8012* (2013.01); *H01L 2224/80895* (2013.01); *H01L 2224/80896* (2013.01); *H01L 2224/80908* (2013.01)

(56) References Cited

U.S. PATENT DOCUMENTS

| | | |
|---|---|---|
| 6,554,046 B1 | 4/2003 | Bryan et al. |
| 6,669,803 B1 | 12/2003 | Kathman et al. |
| 7,589,950 B2 | 9/2009 | Parkhe et al. |
| 8,070,911 B2 | 12/2011 | Himori et al. |
| 8,147,630 B2 | 4/2012 | George |
| 8,469,368 B2 | 6/2013 | Kenworthy et al. |
| 8,684,256 B2 | 4/2014 | Elliot et al. |
| 9,869,392 B2 | 1/2018 | Schaefer et al. |
| 10,157,757 B2 | 12/2018 | Lin et al. |
| 10,204,813 B2 | 2/2019 | Yin et al. |
| 11,916,040 B2 | 2/2024 | Li |
| 2007/0164476 A1 | 7/2007 | Wu et al. |
| 2010/0021577 A1 | 1/2010 | Stewart et al. |
| 2015/0318260 A1 | 11/2015 | Lin et al. |
| 2018/0350639 A1 | 12/2018 | Wei et al. |
| 2020/0055296 A1 | 2/2020 | Kim et al. |

FOREIGN PATENT DOCUMENTS

| | | |
|---|---|---|
| CN | 107785287 | 3/2018 |
| CN | 109887860 | 6/2019 |
| KR | 10-1998-0071438 | 10/1998 |
| KR | 10-2011-0089334 | 8/2011 |

OTHER PUBLICATIONS

Office Action in Korean Appln. No. 10-2019-0101873, mailed on Feb. 20, 2024, 14 pages (with English translation).

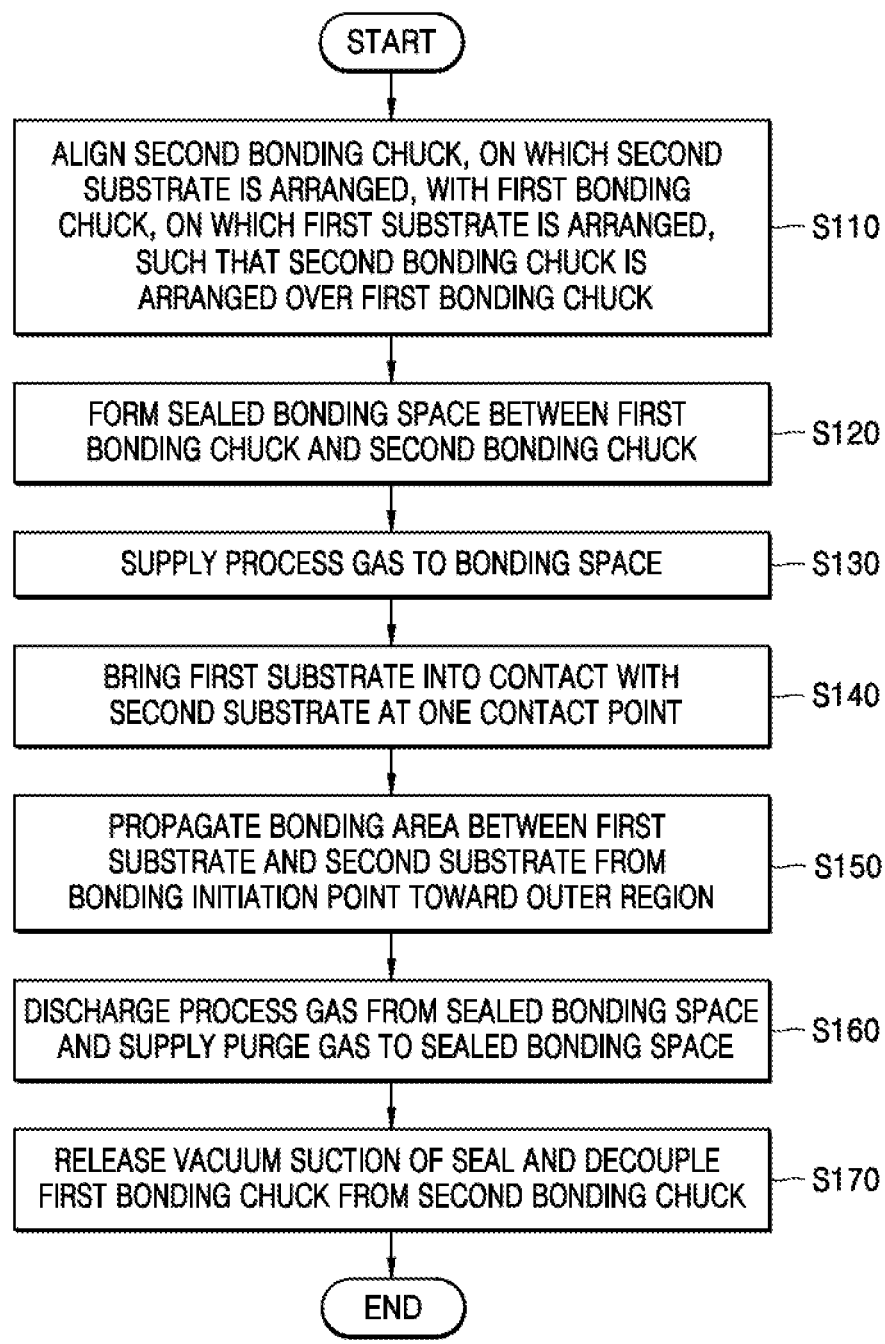

SUBSTRATE BONDING APPARATUS AND METHOD OF MANUFACTURING SEMICONDUCTOR DEVICE BY USING THE SAME

CROSS-REFERENCE TO RELATED APPLICATION

This is a Continuation of U.S. application Ser. No. 16/933,055, filed Jul. 20, 2020, which claims benefit of priority under U.S.C. § 119 to Korean Patent Application No. 10-2019-0101873, filed on Aug. 20, 2019, in the Korean Intellectual Property Office, the disclosure of which is incorporated by reference herein in its entirety.

BACKGROUND

The inventive concept relates to a substrate bonding apparatus and a method of manufacturing a semiconductor device using the substrate bonding apparatus.

A semiconductor device is an electrical component that uses the properties of a semiconductor material for a primary function. Semiconductor devices are used in applications such as cell phones, televisions, cameras, and computers. Various manufacturing processes are used to create semiconductor devices.

A substrate bonding process is one example process for manufacturing a semiconductor device. A direct bonding process is an example of a substrate bonding process. The direct bonding process bonds two surfaces of different wafers to produce a single substrate, providing stacked semiconductor wafers for the semiconductor device.

However, defects in the direct bonding process may occur which create voids between the wafers. For example, water vaper condensation may occur when the wafers are bonded together, causing void defects. The void defects may cause deterioration to the bonded wafers. Therefore, there is a need in the art for a wafer bonding method and apparatus to reduce water vaper condensation in the direct bonding process of semiconductor wafers.

SUMMARY

The inventive concept provides a substrate bonding apparatus and a method of manufacturing a semiconductor device using the substrate bonding apparatus.

According to an aspect of the inventive concept, there is provided a substrate bonding apparatus for bonding a first substrate to a second substrate, the substrate bonding apparatus including: a first bonding chuck configured to hold the first substrate on a first surface of the first bonding chuck; a second bonding chuck configured to hold the second substrate on a second surface of the second bonding chuck, the second surface facing the first surface of the first bonding chuck; a seal arranged between the first bonding chuck and the second bonding chuck and adjacent to at least one edge of the first substrate and at least one edge of the second substrate, and configured to enclose a bonding space; and a process gas supply device configured to supply a process gas to the bonding space enclosed by the seal.

According to another aspect of the inventive concept, there is provided a substrate bonding apparatus for bonding a first substrate to a second substrate, the substrate bonding apparatus including: a first bonding chuck configured to hold the first substrate on a first surface of the first bonding chuck; a second bonding chuck configured to hold the second substrate on a second surface of the second bonding chuck, the second surface facing the first surface of the first bonding chuck; a seal arranged between the first bonding chuck and the second bonding chuck and adjacent to at least one edge of the first substrate and at least one edge of the second substrate; a process gas supply device configured to supply a process gas to a bonding space surrounded by the seal, the process gas supply device including a temperature controller and a pressure controller, the temperature controller being configured to adjust a temperature of the process gas, and the pressure controller being configured to adjust a pressure of the process gas; a temperature sensor configured to sense a temperature of the bonding space; a pressure sensor configured to sense a pressure of the bonding space; and a controller configured to control the temperature controller and the pressure controller, wherein the controller is configured to: generate a feedback temperature control signal for controlling the temperature controller, based on the temperature of the bonding space sensed by the temperature sensor; and generate a feedback pressure control signal for controlling the pressure controller, based on the pressure of the bonding space sensed by the pressure sensor.

According to yet another aspect of the inventive concept, there is provided a substrate bonding apparatus for bonding a first substrate to a second substrate, the substrate bonding apparatus including: a first bonding chuck configured to hold the first substrate on a first surface of the first bonding chuck; a second bonding chuck configured to hold the second substrate on a second surface of the second bonding chuck, the second surface facing the first surface of the first bonding chuck; a seal arranged between the first bonding chuck and the second bonding chuck and adjacent to at least one edge of the first substrate and at least one edge of the second substrate; and a process gas supply device configured to supply a process gas to a bonding space surrounded by the seal, the process gas supply device including a temperature controller configured to adjust a temperature of the process gas and a pressure controller configured to adjust a pressure of the process gas, wherein the seal includes: a first portion detachably coupled to the first bonding chuck; and a second portion coupled to the second bonding chuck, and the first portion of the seal is coupled to the first bonding chuck by a vacuum pressure applied to a vacuum groove of the first bonding chuck, and thereby defines the bonding space.

According to yet another aspect of the inventive concept, there is provided a method of manufacturing a semiconductor device, the method including: aligning a second bonding chuck, on which a second substrate is arranged, with a first bonding chuck, on which a first substrate is arranged, such that the second bonding chuck is arranged over the first bonding chuck; forming a bonding space between the first bonding chuck and the second bonding chuck by securing a scal between the first bonding chuck and the second bonding chuck, the bonding space being surrounded by the seal, and the seal surrounding an edge of the first substrate and an edge of the second substrate; supplying a process gas to the bonding space; and bonding the first substrate to the second substrate.

According to yet another aspect of the inventive concept, a method of manufacturing a semiconductor device includes providing a first substrate disposed on a first bonding chuck and a second substrate disposed on a second bonding chuck, wherein the first substrate and the second substrate are located between the first bonding chuck and the second bonding chuck; providing a seal in direct contact with the first bonding chuck and the second bonding chuck to enclose a bonding space between the first bonding chuck and the second bonding chuck; supplying a process gas to the bonding space, the process gas having less reactivity with the first substrate and the second substrate compared with ambient gas outside the bonding space; and bonding the first substrate to the second substrate. In some cases, a purge gas may be supplied to the bonding space after bonding the first substrate to the second substrate to discharge the process gas from the bonding space.

BRIEF DESCRIPTION OF THE DRAWINGS

Embodiments of the inventive concept will be more clearly understood from the following detailed description taken in conjunction with the accompanying drawings in which:

FIG. 7 is a flowchart illustrating a substrate bonding method according to example embodiments of the inventive concept;

DETAILED DESCRIPTION OF THE EMBODIMENTS

Figure 1:
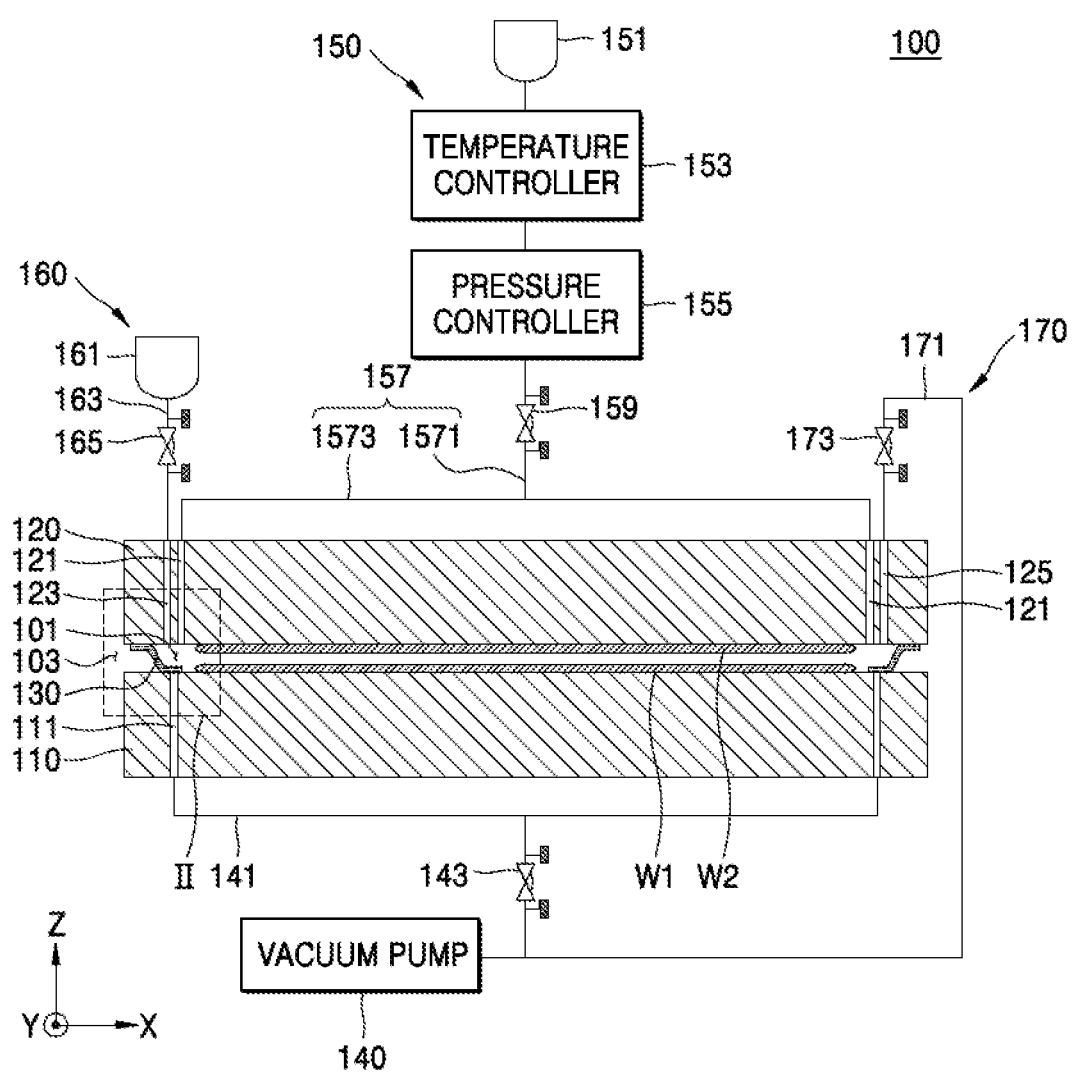
FIG. 1 is a cross-sectional view illustrating a substrate bonding apparatus according to example embodiments of the inventive concept.

The present disclosure relates to systems and methods for reducing water vaper related manufacturing defects between bonded wafers. Conventional methods supply a process gas to an open space during bonding. According to embodiments of the present disclosure, a sealed bonding space may be formed by using a physical seal during the bonding process of a semiconductor. A process gas such as Helium may be supplied to the sealed bonding space to control the temperature and pressure of the sealed bonding space.

Defects due to water vapor condensation, temperature/pressure non-uniformity, and the like may be reduced when the bonding process between two wafers is performed in the sealed bonding space, where the sealed bonding space have controlled temperature and pressure.

Additionally, the present disclosure provides a method and apparatus for supplying the process gas to the bonding space sealed by the seal. A sealed bonding space provides uniform control of the pressure of the bonding space.

The seal may be ring-shaped member, an upper portion of which is coupled to an upper bonding chuck, and a lower portion of which is attached to a lower bonding chuck (e.g., by vacuum suction). Additionally, the seal may comprise a flexible material such as rubber to absorb vibrations.

Hereinafter, embodiments of the inventive concept will be described in detail with reference to the accompanying drawings. Like components will be denoted by like reference numerals throughout the specification, and repeated descriptions thereof will be omitted.

Figure 2:
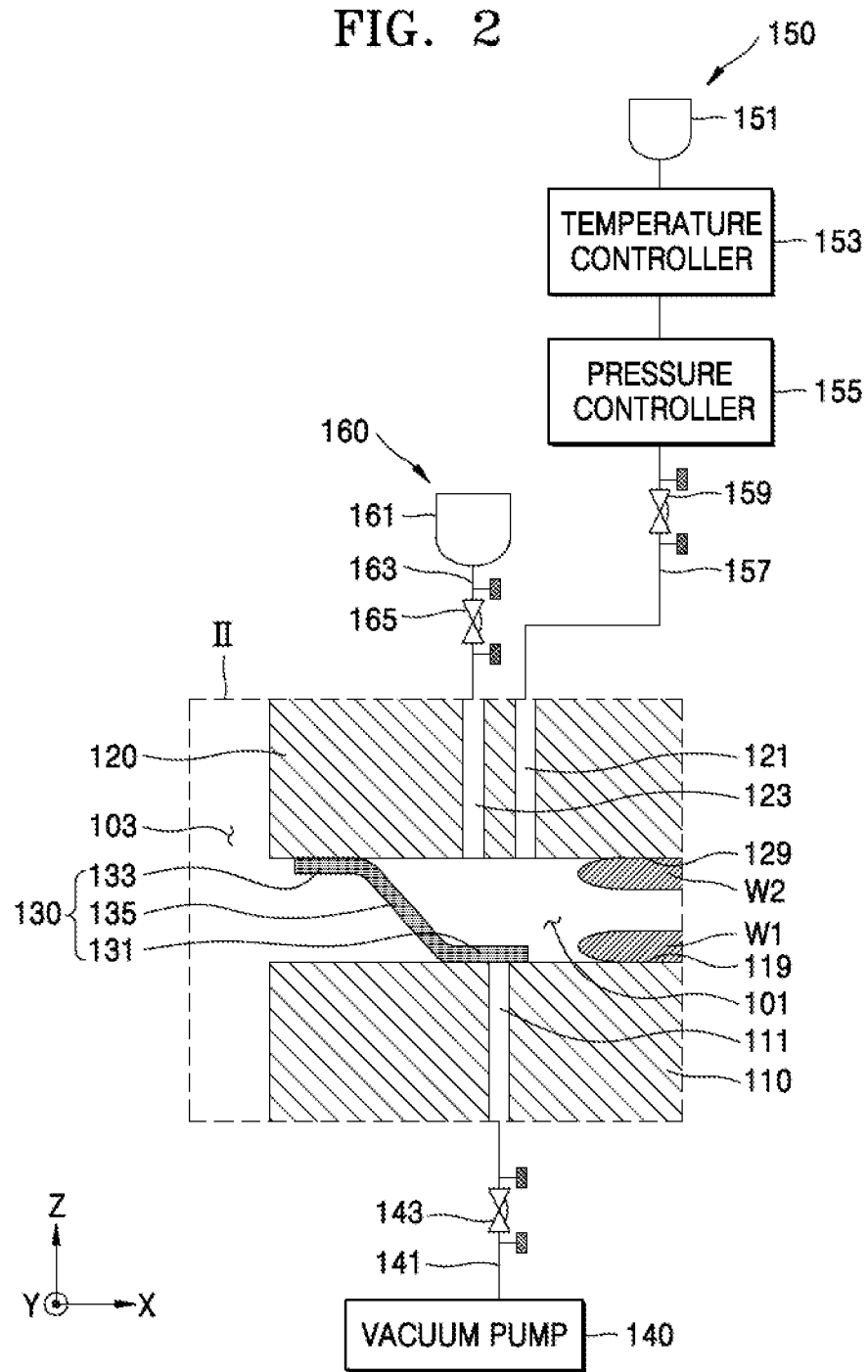
FIG. 2 is an enlarged cross-sectional view illustrating a region indicated by "II" in FIG. 1.

FIG. 1 is a cross-sectional view illustrating a substrate bonding apparatus 100 according to example embodiments of the inventive concept. FIG. 2 is an enlarged cross-sectional view illustrating a region indicated by "II" in FIG. 1.

Referring to FIGS. 1 and 2, the substrate bonding apparatus 100 may include a first bonding chuck 110, a second bonding chuck 120, a seal 130, a vacuum pump 140, a process gas supply device 150, a purge gas supply device 160, and an exhaust device 170.

The first bonding chuck 110 may support a first substrate W1 mounted on a first surface 119 thereof. In example embodiments, the first substrate W1 may be a single-crystal substrate. In example embodiments, the first substrate W1 may be a silicon wafer.

For example, the first bonding chuck 110 may be configured to hold (or secure) the first substrate W1 by using a vacuum pressure or electrostatic force. The first bonding chuck 110 may be configured to apply a lower pressure than an ambient pressure to one surface of the first substrate W1 when the first bonding chuck 110 is configured to hold the first substrate W1 by using a vacuum pressure. The first substrate W1 faces the first surface 119 of the first bonding chuck 110. The first surface 119 may be a support surface of the first bonding chuck 110. For example, the first bonding chuck 110 may have a vacuum path formed therein and exposed at the first surface 119 thereof. The vacuum path may be connected to the vacuum pump 140 for applying a vacuum pressure. The first bonding chuck 110 may include an electrode receiving applied power and generating electrostatic force for securing the first substrate W1 when the first bonding chuck 110 is configured to hold the first substrate W1 by using electrostatic force.

The second bonding chuck 120 may support a second substrate W2 mounted on a second surface 129 thereof. In example embodiments, the second substrate W2 may be a single-crystal substrate. In example embodiments, the second substrate W2 may be a silicon wafer.

The second bonding chuck 120 may be configured to hold the second substrate W2 by using a vacuum pressure or electrostatic force. Here, the first bonding chuck 110 may be a lower bonding chuck. The second bonding chuck 120 may be an upper bonding chuck arranged over the first bonding chuck 110. The second surface 129 of the second bonding chuck 120 may face the first surface 119 of the first bonding chuck 110. A first bonding surface of the first substrate W1 supported by the first bonding chuck 110 may face a second bonding surface of the second substrate W2 supported by the second bonding chuck 120. However, the inventive concept is not limited thereto and the second bonding chuck 120 may be a lower bonding chuck. The first bonding chuck 110 may be an upper bonding chuck arranged over the second bonding chuck 120.

The seal 130 may be arranged between the first bonding chuck 110 and the second bonding chuck 120. Additionally, the seal 130 may surround both an edge of the first substrate W1 supported by the first bonding chuck 110 and an edge of the second substrate W2 supported by the second bonding chuck 120. For example, the seal 130 may be a ring-shaped member. The seal 130 may be positioned adjacent to at least one edge of the first bonding chuck 110 and the second bonding chuck 120, and may enclose a space between the first bonding chuck 110 and the second bonding chuck 120 (i.e., the bonding space 101).

When a lower portion of the seal 130 is coupled to the first bonding chuck 110 and an upper portion of the seal 130 is coupled to the second bonding chuck 120, a bonding space 101 defined by the seal 130 may be formed between the first surface 119 of the first bonding chuck 110 and the second surface 129 of the second bonding chuck 120.

In example embodiments, the seal 130 may seal the bonding space 101 while bonding between the first substrate W1 and the second substrate W2 is performed.

In example embodiments, the seal 130 may include a first portion 131. The first portion 131 is detachably coupled to the first surface 119 of the first bonding chuck 110 and a second portion 133. The second portion 133 is opposite the first portion 131 and is coupled to the second surface 129 of the second bonding chuck 120. The first portion 131 of the seal 130 may be a lower portion of the seal 130. The second portion 133 of the seal 130 may be an upper portion of the seal 130. For example, the second portion 133 of the seal 130 may be mechanically secured to the second bonding chuck 120. In this case, the first portion 131 of the seal 130 may be coupled to the first bonding chuck 110 and thus seal the bonding space 101. Additionally, the first portion 131 of the seal 130 may be decoupled from the first bonding chuck 110. Therefore, the decoupling may cause the bonding space 101 inside the seal 130 to communicate with an external space 103 outside the seal 130.

In example embodiments, the first portion 131 of the seal 130 may be attached to the first bonding chuck 110 by vacuum suction. The first bonding chuck 110 may include a vacuum groove 111. The vacuum groove 111 may be exposed at a position apart from outside the edge of the first substrate W1 while arranged at the first surface 119 of the first bonding chuck 110.

In example embodiments, the first bonding chuck 110 may include a plurality of vacuum grooves 111. The plurality of vacuum grooves 111 may be arranged apart from each other at substantially regular intervals along an outer circumference of the first bonding chuck 110. Distances between the center of the first bonding chuck 110 and the respective plurality of vacuum grooves 111 may be substantially equal.

The vacuum pump 140 may be connected to the vacuum groove 111 of the first bonding chuck 110 via a vacuum line 141. A shut-off valve 143 may be mounted on the vacuum line 141. The vacuum pump 140 may be configured to apply or release a vacuum pressure in the vacuum groove 111. The vacuum pump 140 may hold the first portion 131 of the seal 130 to the first surface 119 of the first bonding chuck 110 by applying a vacuum pressure to the vacuum groove 111 of the first bonding chuck 110. Additionally, the vacuum pump 140 may cause the first portion 131 of the seal 130 to be in a state of being detachable from the first surface 119 of the first bonding chuck 110 by releasing the vacuum pressure from the vacuum groove 111 of the first bonding chuck 110.

The seal 130 may include a flexible material and thus function as a damper absorbing vibrations while arranged between the first bonding chuck 110 and the second bonding chuck 120. For example, the seal 130 may absorb vibrations generated from the first bonding chuck 110 and/or the second bonding chuck 120. In example embodiments, the seal 130 may include rubber, silicone, or a flexible synthetic resin.

In example embodiments, the seal 130 may include a connection portion 135 obliquely extending between the first portion 131 and the second portion 133. For example, as shown in FIG. 2, the connection portion 135 may be inclined downwards from the second portion 133 toward the first portion 131 due to the first portion 131 of the seal 130 being farther apart from an edge of the first bonding chuck 110 in a horizontal direction (for example, an X-direction and/or a Y-direction) than the second portion 133 of the seal 130. When the first portion 131 and the second portion 133 are respectively held to the first bonding chuck 110 and the second bonding chuck 120, the connection portion 135 may effectively absorb impacts or vibrations applied to the seal 130 in a lateral direction while flexibly moving or changing in shape in the lateral direction.

The process gas supply device 150 may supply a process gas with a certain temperature and a certain pressure to the bonding space 101 surrounded by the seal 130. For example, the process gas supply device 150 may include a process gas source 151, a process gas supply line 157, and a shut-off valve 159 mounted on the process gas supply line 157. The process gas supply line 157 may provide a path through which the process gas flows. The process gas supply line 157 extends between the process gas source 151 and a process gas supply hole 121 arranged in the second bonding chuck 120.

The process gas supply device 150 may supply the process gas to the bonding space 101 through the process gas supply hole 121 arranged in the second bonding chuck 120. For example, the process gas supply hole 121 may be arranged between the edge of the second substrate W2 and the seal 130. The process gas supply hole 121 may supply the process gas to the bonding space 101. The process gas may have minimal reactivity with the first substrate W1, a material film on the first substrate W1, the second substrate W2, a material film on the second substrate W2, and the like. In example embodiments, the process gas supply device 150 may be configured to supply helium (He), nitrogen ($N_2$), argon (Ar), or a combination thereof to the bonding space 101.

The process gas supply device 150 may include a temperature controller 153 mounted on the process gas supply line 157. The temperature controller 153 may include various devices. The devices may be a heater, a cooler, a heat exchanger, a temperature regulator, and the like. The devices are used to maintain or change the temperature of the process gas flowing along the process gas supply line 157.

Additionally, the process gas supply device 150 may include a pressure controller 155 mounted on the process gas supply line 157. The pressure controller 155 may include various devices that are used to maintain the pressure of the process gas constant or change the pressure of the process gas flowing along the process gas supply line 157. The pressure controller 155 may include a pressure regulator or a pressure control valve. For example, the pressure controller 155 may include a servo valve and a solenoid valve.

Although FIG. 1 illustrates the process gas supplied from the process gas source 151 sequentially passes through the temperature controller 153 and the pressure controller 155 in this stated order, the pressure controller 155 may be arranged between the temperature controller 153 and the process gas source 151. Additionally, the temperature controller 153 and the pressure controller 155 may be implemented by a single device in which functions thereof are integrated.

Although not shown in FIGS. 1 and 2, the process gas supply device 150 may include various sensors, which are configured to sense a temperature and a pressure of the process gas passing through the temperature controller 153 and the pressure controller 155. The process gas supply device 150 may also include a mass flow controller for controlling a flow rate of the process gas.

When the bonding space 101 is sealed by the seal 130, the process gas supply device 150 may fill the bonding space 101 with the process gas by supplying the process gas to the bonding space 101. Here, the process gas supply device 150 may adjust the temperature and pressure of the bonding space 101 by adjusting the temperature and pressure of the process gas supplied to the bonding space 101.

The purge gas supply device 160 may supply a purge gas to the bonding space 101. For example, the purge gas supply device 160 may include a purge gas source 161, a purge gas supply line 163, and a shut-off valve 165 mounted on the purge gas supply line 163, the purge gas supply line 163 providing a path through which the purge gas flows. The purge gas supply line 163 extends between the purge gas source 161 and a purge gas supply hole 123 arranged in the second bonding chuck 120. For example, the purge gas supply device 160 may supply the purge gas to the bonding space 101 through the purge gas supply hole 123. For example, the purge gas supply hole 123 may be arranged between the edge of the second substrate W2 and the seal 130. For example, the purge gas supply device 160 may be configured to supply nitrogen ($N_2$) gas, clean air, dry air, or the like to the bonding space 101.

The exhaust device 170 may exhaust the bonding space 101. For example, the exhaust device 170 may include the vacuum pump 140, an exhaust line 171, and a shut-off valve 173 mounted on the exhaust line 171. The exhaust line 171 may extend between the vacuum pump 140 and an exhaust hole 125 of the second bonding chuck 120. The vacuum pump 140 may be configured to exhaust the bonding space 101 through the exhaust line 171. The vacuum pump 140 may also be configured to hold the seal 130 by vacuum suction through the vacuum line 141. Alternatively, in other example embodiments, the substrate bonding apparatus 100 may further include another exhaust pump for exhausting the bonding space 101, separate from the vacuum pump 140 for vacuum suction of the seal 130.

The exhaust device 170 may remove gas from the bonding space 101 through the exhaust hole 125 arranged in the second bonding chuck 120. When the bonding between the first substrate W1 and the second substrate W2 is completed, the exhaust device 170 may remove the gas from the bonding space 101. Additionally, during the bonding between the first substrate W1 and the second substrate W2, the exhaust device 170 may decrease the pressure of the bonding space 101 to an appropriate level by partially discharging the gas from the bonding space 101. During the bonding between the first substrate W1 and the second substrate W2, the pressure of the bonding space 101 is greater than a target pressure.

When the bonding between the first substrate W1 and the second substrate W2 is completed, the exhaust device 170 may discharge the process gas from the bonding space 101 sealed by the seal 130. As a result, the purge gas supply device 160 may supply the purge gas to the sealed bonding space 101. In example embodiments, the purge gas supply device 160 may fill the bonding space 101 with the purge gas such that the pressure of the bonding space 101 sealed by the seal 130 is atmospheric pressure.

During the bonding between the first substrate W1 and the second substrate W2, a bonding area between the two substrates is spontaneously propagated from the center toward an outer region of each substrate when the center of the second substrate W2 is brought into contact with the first substrate W1 by applying external force to the second substrate W2. For example, the bonding between the two substrates may gradually proceed from an initial contact point between the two substrates toward the outer regions of the two substrates by spontaneous bonding propagation, even without applying an external force. As the pressure at an interface between the two substrates decreases in the vicinity of the outer regions of the two substrates, water vapor is condensed between the two substrates. Therefore, void defects may be generated between the two substrates. Additionally, there may be an issue of deterioration of the degree of bonding alignment between the two substrates due to temperature and/or pressure non-uniformity occurring in the vicinity of the outer regions of the two substrates.

However, according to example embodiments of the inventive concept, the bonding space 101 may be filled with the process gas with a controlled temperature and a controlled pressure by supplying the process gas to the bonding space 101 defined by the seal 130. During the bonding between the first substrate W1 and the second substrate W2, the generation of voids between the two substrates due to water vapor condensation or the like may be prevented due to the temperature and pressure of the bonding space 101 being uniformly controlled by the process gas. The deterioration of the degree of bonding alignment between the two substrates due to temperature non-uniformity and/or pressure non-uniformity may be prevented.

Additionally, according to example embodiments of the inventive concept, the pressure of the bonding space 101 may be adjusted by supplying the process gas to the bonding space 101 defined by the seal 130, thereby adjusting a bonding rate between the two substrates. For example, the bonding rate between the two substrates may be relatively reduced by adjusting the pressure of the bonding space 101 to an atmospheric pressure level. to prevent fast bonding between the two substrates in a vacuum environment or a pressure environment. In this case, as the bonding rate between the two substrates is reduced and stress acting between the two substrates may be relaxed, therefore, increasing the reliability of a bonding process.

Figure 3:
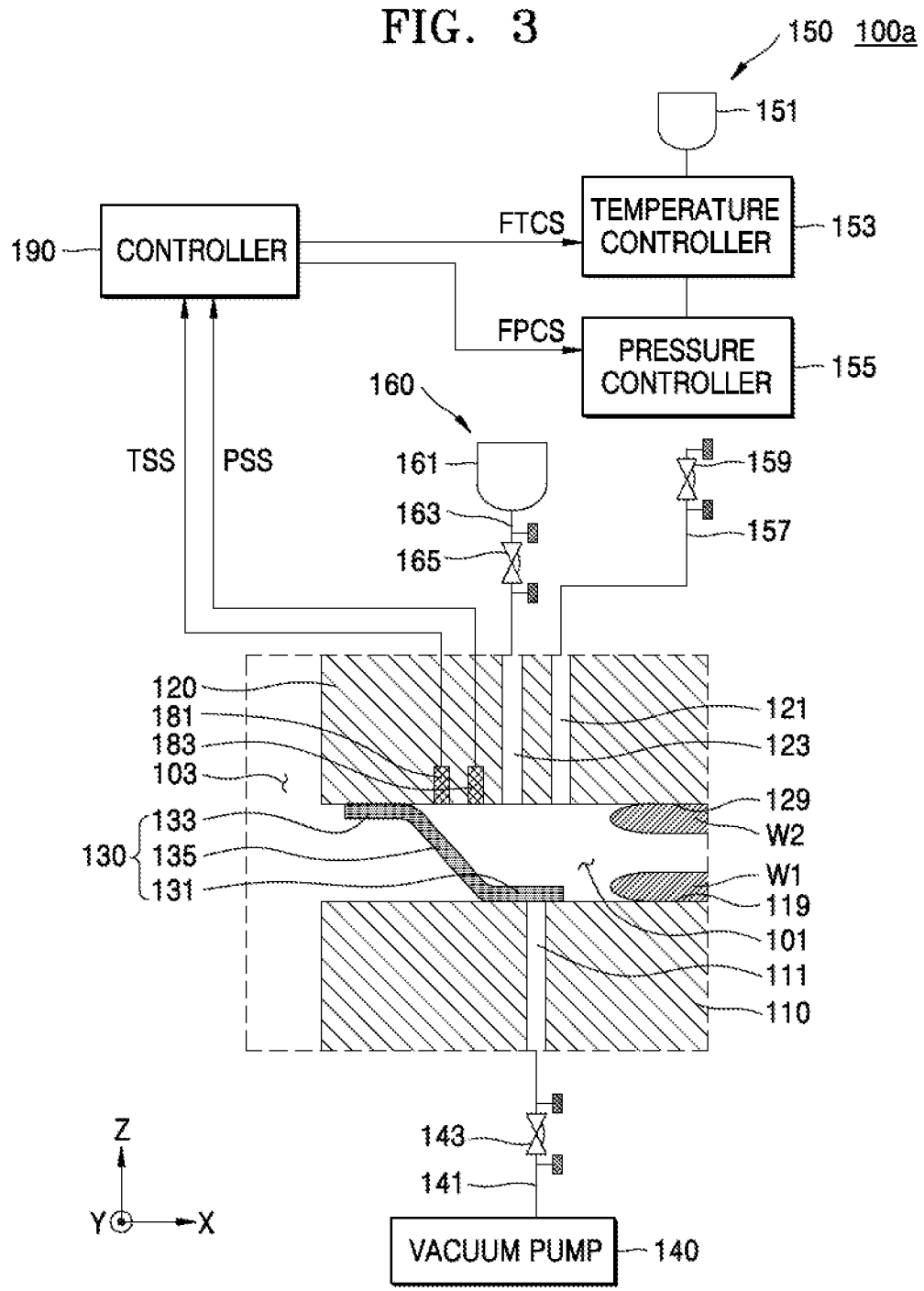
FIG. 3 is a cross-sectional view illustrating a portion of a substrate bonding apparatus according to example embodiments of the inventive concept.

FIG. 3 is a cross-sectional view illustrating a portion of a substrate bonding apparatus 100*a*, according to example embodiments of the inventive concept. In particular, FIG. 3 illustrates a cross-sectional view of a portion corresponding to the region indicated by "II" in FIG. 1.

The substrate bonding apparatus 100*a* shown in FIG. 3 may be substantially identical or similar to the substrate bonding apparatus 100 described with reference to FIGS. 1 and 2 except that the substrate bonding apparatus 100*a* further includes a temperature sensor 181, a pressure sensor 183, and a controller 190. For descriptive convenience, differences from the substrate bonding apparatus 100 described with reference to FIGS. 1 and 2 will be primarily described.

Referring to FIG. 3, the substrate bonding apparatus 100*a* may include the temperature sensor 181 and the pressure sensor 183.

The temperature sensor 181 may be configured to sense the temperature of the bonding space 101. For example, the temperature sensor 181 may be mounted in the first bonding chuck 110 and/or the second bonding chuck 120. The temperature sensor 181 may be a non-contact type temperature sensor such as an infrared sensor or a contact type temperature sensor such as a resistance temperature detector.

In example embodiments, the substrate bonding apparatus 100*a* may include a plurality of temperature sensors 181.

The plurality of temperature sensors 181 may be configured to respectively sense temperatures of different portions of the bonding space 101. For example, the plurality of temperature sensors 181 may be arranged symmetrically about the center of the first bonding chuck 110 and/or the center of the second bonding chuck 120. Here, overall temperature uniformity of the bonding space 101 may be determined based on the temperatures respectively sensed by the plurality of temperature sensors 181.

The pressure sensor 183 may be configured to sense the pressure of the bonding space 101. For example, the pressure sensor 183 may be mounted in the first bonding chuck 110 and/or the second bonding chuck 120. The pressure sensor 183 may include, for example, a strain gauge, a capacitive pressure sensor, a potentiometric pressure sensor, or the like.

In example embodiments, the substrate bonding apparatus 100a may include a plurality of pressure sensors 183. The plurality of pressure sensors 183 may be configured to respectively sense pressures of different portions of the bonding space 101. For example, the plurality of pressure sensors 183 may be arranged symmetrically about the center of the first bonding chuck 110 and/or the center of the second bonding chuck 120. Here, an overall pressure uniformity of the bonding space 101 may be determined based on the pressures respectively sensed by the plurality of pressure sensors 183.

The controller 190 may control operations of each of the first bonding chuck 110, the second bonding chuck 120, the vacuum pump 140, the process gas supply device 150, the purge gas supply device 160, and the exhaust device 170.

The controller 190 may be configured to perform feedback temperature control on the temperature of the bonding space 101 based on a temperature signal TSS sensed by the temperature sensor 181. The controller 190 may also perform feedback pressure control on the pressure of the bonding space 101 based on a pressure signal PSS sensed by the pressure sensor 183.

In example embodiments, the controller 190 may receive the temperature signal TSS of the bonding space 101. The temperature signal TSS is sensed by the temperature sensor 181. The temperature sensor 181 may generate a feedback temperature control signal FTCS for control of the temperature controller 153 based on the sensed temperature signal TSS of the bonding space 101. The controller 190 may apply the generated feedback temperature control signal FTCS to the temperature controller 153. The temperature controller 153 may adjust the temperature of the process gas by operating according to the feedback temperature control signal FTCS.

The controller 190 may determine whether the temperature of the bonding space 101 falls within a pre-set target temperature range. The temperature of the bonding space 101 may be sensed by the temperature sensor 181. The controller 190 may change the temperature of the process gas when determining that the temperature sensed by the temperature sensor 181 is outside the pre-set target temperature range. The process gas is supplied to the bonding space 101 by applying the feedback temperature control signal FTCS to the temperature controller 153.

For example, while the bonding between the first substrate W1 and the second substrate W2 is performed, the controller 190 may control operations of the temperature controller 153 such that the temperature of the bonding space 101 is between 15° C. and 25° C. or is around the temperature of the room.

In example embodiments, the controller 190 may receive the pressure signal PSS of the bonding space 101, which is sensed by the pressure sensor 183, and may generate a feedback pressure control signal FPCS for control of the pressure controller 155, based on the sensed pressure signal PSS of the bonding space 101. The controller 190 may apply the generated feedback pressure control signal FPCS to the pressure controller 155, and the pressure controller 155 may adjust the pressure of the process gas by operating according to the feedback pressure control signal FPCS.

The controller 190 may determine whether the pressure of the bonding space 101, which is sensed by the pressure sensor 183, falls within a pre-set target pressure range. When determining that the pressure sensed by the pressure sensor 183 is outside the pre-set target pressure range, the controller 190 may change the pressure of the process gas, which is supplied to the bonding space 101, by applying the feedback pressure control signal FPCS to the pressure controller 155.

For example, when the bonding between the first substrate W1 and the second substrate W2 is performed, the controller 190 may control operations of the pressure controller 155 such that the pressure of the bonding space 101 is about 1 atm to about 1.5 atm.

The controller 190 may be implemented by hardware, firmware, software, or any combination thereof. For example, the controller 190 may include a computing device such as a workstation computer, a desktop computer, a laptop computer, a tablet computer, or the like. The controller 190 may include a single loop controller, a microprocessor, a central processing unit (CPU), a graphics processing unit (GPU), or a processor configured by software, dedicated hardware, or firmware. For example, the controller 190 may be implemented by a general-purpose computer, or application-specific hardware such as a digital signal processor (DSP), a field-programmable gate array (FPGA), or an application-specific integrated circuit (ASIC).

In some example embodiments, operations of the controller 190 may be implemented by instructions that may be read and executed by one or more processors, the instructions being stored in a machine-readable medium. The machine-readable medium may include any mechanism for storing and/or transmitting information in a form readable by a machine (for example, a computing device). For example, the machine-readable medium may include read-only memory (ROM), random access memory (RAM), a magnetic disk storage medium, an optical storage medium, flash memory devices, electrical, optical, acoustic, or other types of signals (for example, carrier waves, infrared signals, digital signals, or the like), and any other signals.

The controller 190 may be implemented by firmware, software, routines, or instructions for performing a bonding process. For example, the controller 190 may be implemented by software to perform functions such as generating signals for performing a bonding process, receiving data for feedback, and controlling the bonding process by performing certain calculations.

Figure 4:
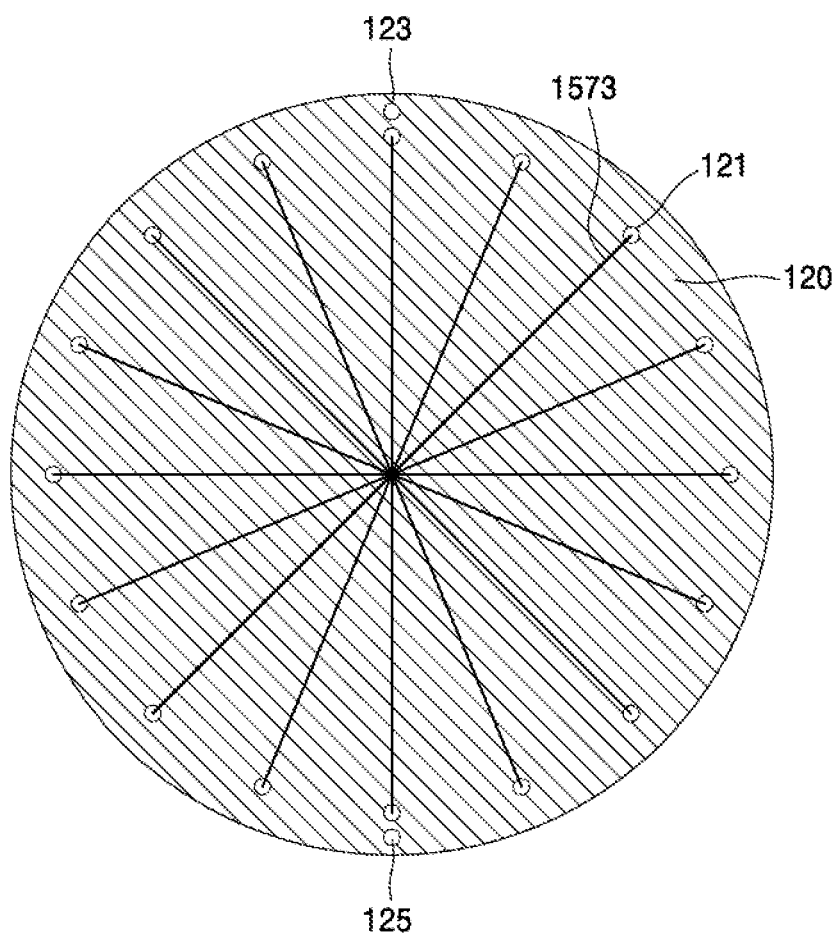
FIG. 4 is a plan view illustrating a second bonding chuck of a substrate bonding apparatus according to example embodiments of the inventive concept.

FIG. 4 is a plan view illustrating the second bonding chuck 120 of a substrate bonding apparatus according to example embodiments of the inventive concept.

Referring to FIG. 4, together with FIGS. 1 and 2, the second bonding chuck 120 may include a plurality of process gas supply holes 121. The plurality of process gas supply holes 121 may be arranged apart from each other at substantially regular intervals along an outer circumference of the second bonding chuck 120. A distance between the center of the second bonding chuck 120 and each of the plurality of process gas supply holes 121 may be substantially constant. In other words, the plurality of process gas supply holes 121 may be arranged symmetrically about the center of the second bonding chuck 120. Additionally, an angle formed by two adjacent process gas supply holes 121 and the center of the second bonding chuck 120 when the center of the second bonding chuck 120 is the vertex of the angle may be substantially constant.

The substrate bonding apparatus of FIG. 4 may include a main supply line 1571 connected to the process gas source 151 of the process gas supply device 150. The substrate bonding apparatus may also include a plurality of branch supply lines 1573 branching off from the main supply line 1571. Each of the plurality of branch supply lines 1573 may extend to each of the plurality of process gas supply holes 121 of the second bonding chuck 120. The process gas flowing along the main supply line 1571 is divided by the plurality of branch supply lines 1573. The process gas flowing along each of the plurality of branch supply lines 1573 may be supplied to the bonding space 101 through each of the plurality of process gas supply holes 121.

Here, respective lengths of the plurality of branch supply lines 1573 may be substantially equal to each other. For example, the respective plurality of branch supply lines 1573 may branch off from the main supply line 1571 at the center of the second bonding chuck 120 and may extend from the branching point toward the respective plurality of process gas supply holes 121. Uniformly controlling the pressure of the bonding space 101 may be increased when the respective lengths of the plurality of branch supply lines 1573 are set equal to each other due to moving distances of the process gas to the injection into the bonding space 101 being equal to each other.

Although FIG. 4 illustrates that sixteen process gas supply holes 121 are arranged in the second bonding chuck 120, the number of process gas supply holes 121 may be less than or greater than sixteen. Additionally, although FIG. 4 illustrates that one purge gas supply hole 123 is arranged in the second bonding chuck 120, the number of purge gas supply holes 123 may be two or more. Further, although FIG. 4 illustrates that one exhaust hole 125 is arranged in the second bonding chuck 120, the number of exhaust holes 125 may be two or more.

Figure 5:
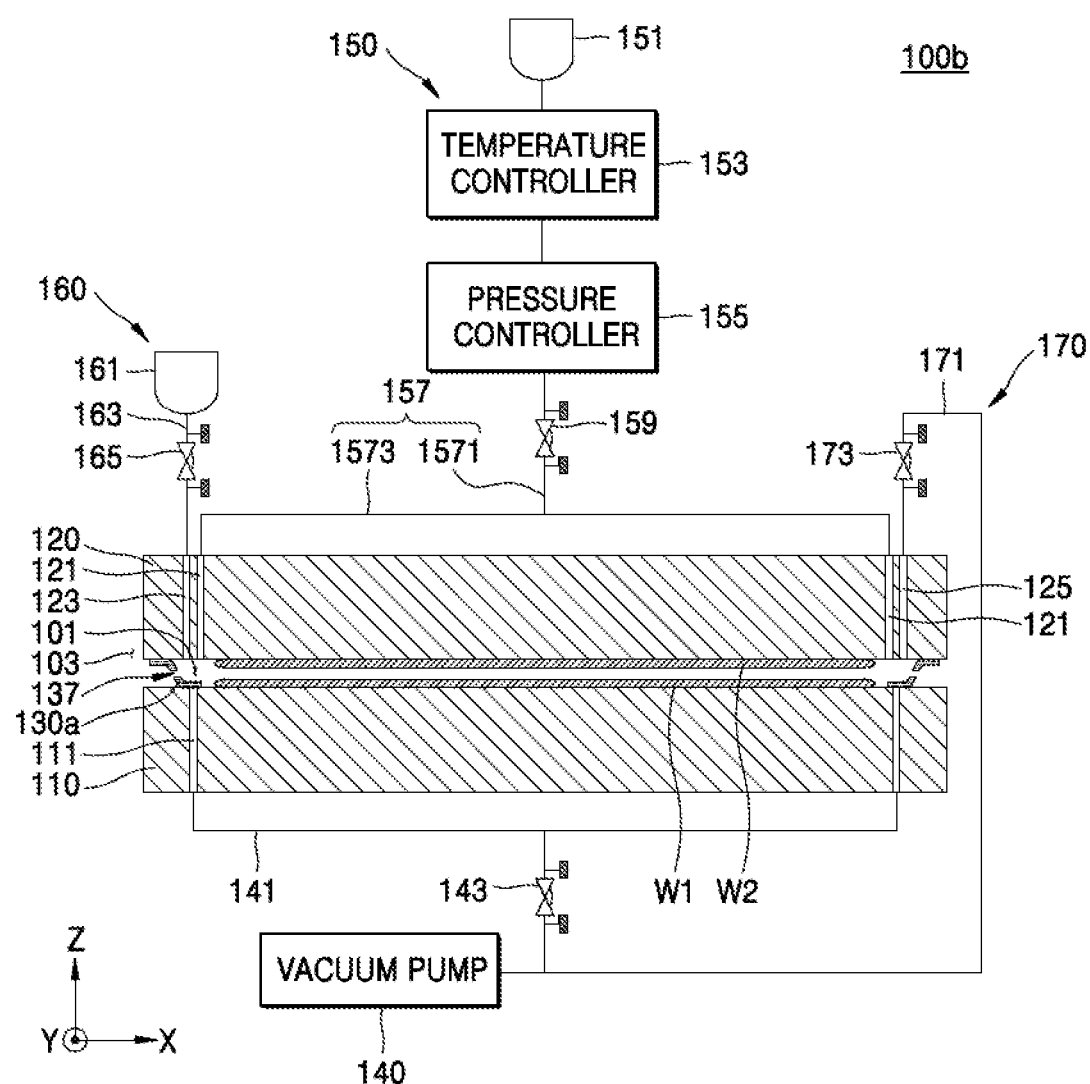
FIG. 5 is a cross-sectional view illustrating a substrate bonding apparatus according to example embodiments of the inventive concept.
Figure 6:
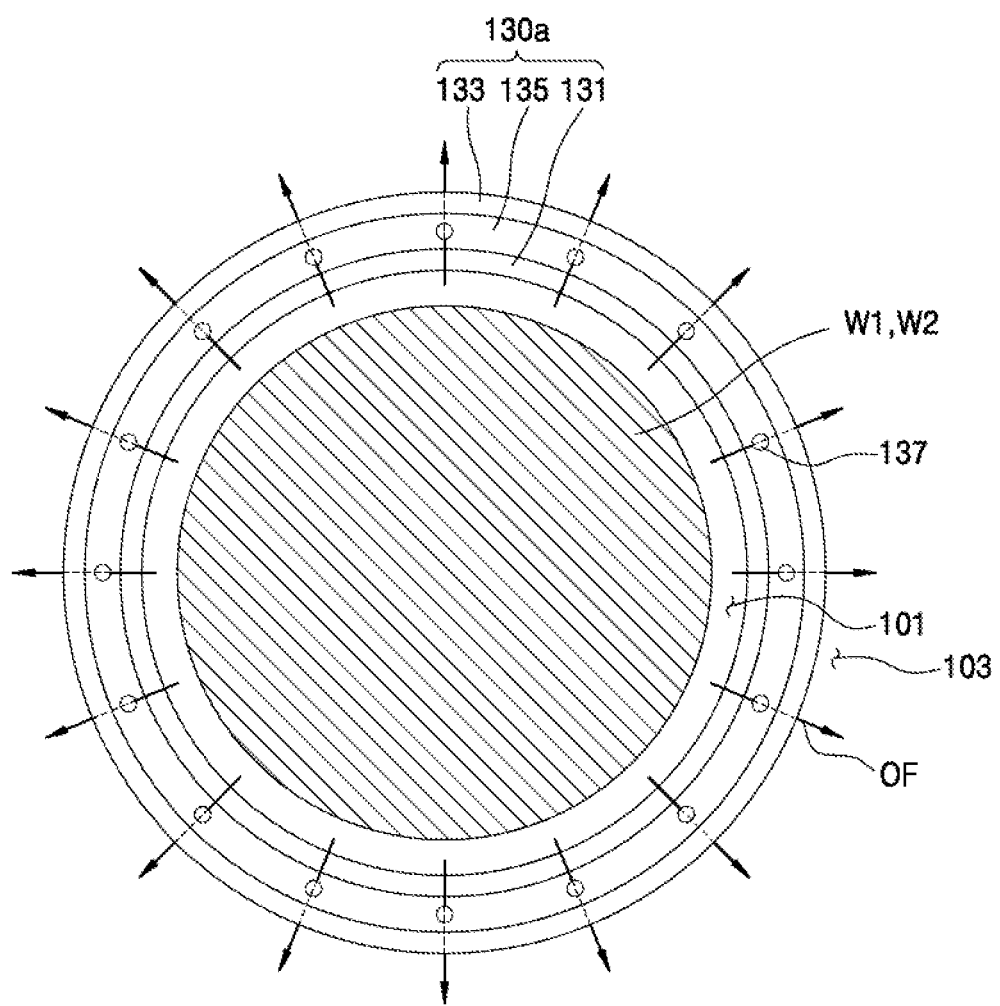
FIG. 6 is a plan view schematically illustrating a seal shown in FIG. 5.

FIG. 5 is a cross-sectional view illustrating a substrate bonding apparatus 100b according to example embodiments of the inventive concept. FIG. 6 is a plan view schematically illustrating a seal 130a shown in FIG. 5.

The substrate bonding apparatus 100b shown in FIGS. 5 and 6 may be substantially identical or similar to the substrate bonding apparatus 100 described with reference to FIGS. 1 and 2 or the substrate bonding apparatus 100a described with reference to FIG. 3 except that the seal 130a of the substrate bonding apparatus 100b includes an outflow hole 137. For descriptive convenience, repeated descriptions given above will be omitted or briefly made.

Referring to FIGS. 5 and 6, the seal 130a may include a plurality of outflow holes 137. Each outflow hole 137 of the seal 130a may allow a movement of a fluid between the bonding space 101 inside the seal 130a and the external space 103 outside the seal 130a.

In example embodiments, during the bonding between the first substrate W1 and the second substrate W2, the controller 190 (see FIG. 3) may control operations of the pressure controller 155 (see FIG. 3) such that the pressure of the bonding space 101 is maintained greater than the pressure of the external space 103 outside the seal 130a. Although outflow OF of the process gas through each outflow hole 137 may occur, inflow of outside air through each outflow hole 137 may be prevented due to the pressure of the bonding space 101 being greater than the pressure of the external space 103.

The plurality of outflow holes 137 may be separated from each other at substantially regular intervals such that the outflow OF of the process gas through each outflow hole 137 is uniform in the bonding space 101.

FIG. 7 is a flowchart illustrating a substrate bonding method according to example embodiments of the inventive concept. FIGS. 8A to 8G are conceptual diagrams illustrating sequential processes of a substrate bonding method according to example embodiments of the inventive concept. Hereinafter, the substrate bonding method using a substrate bonding apparatus according to example embodiments of the inventive concept will be described in detail with reference to FIGS. 7 and 8A to 8G.

Figure 8A:
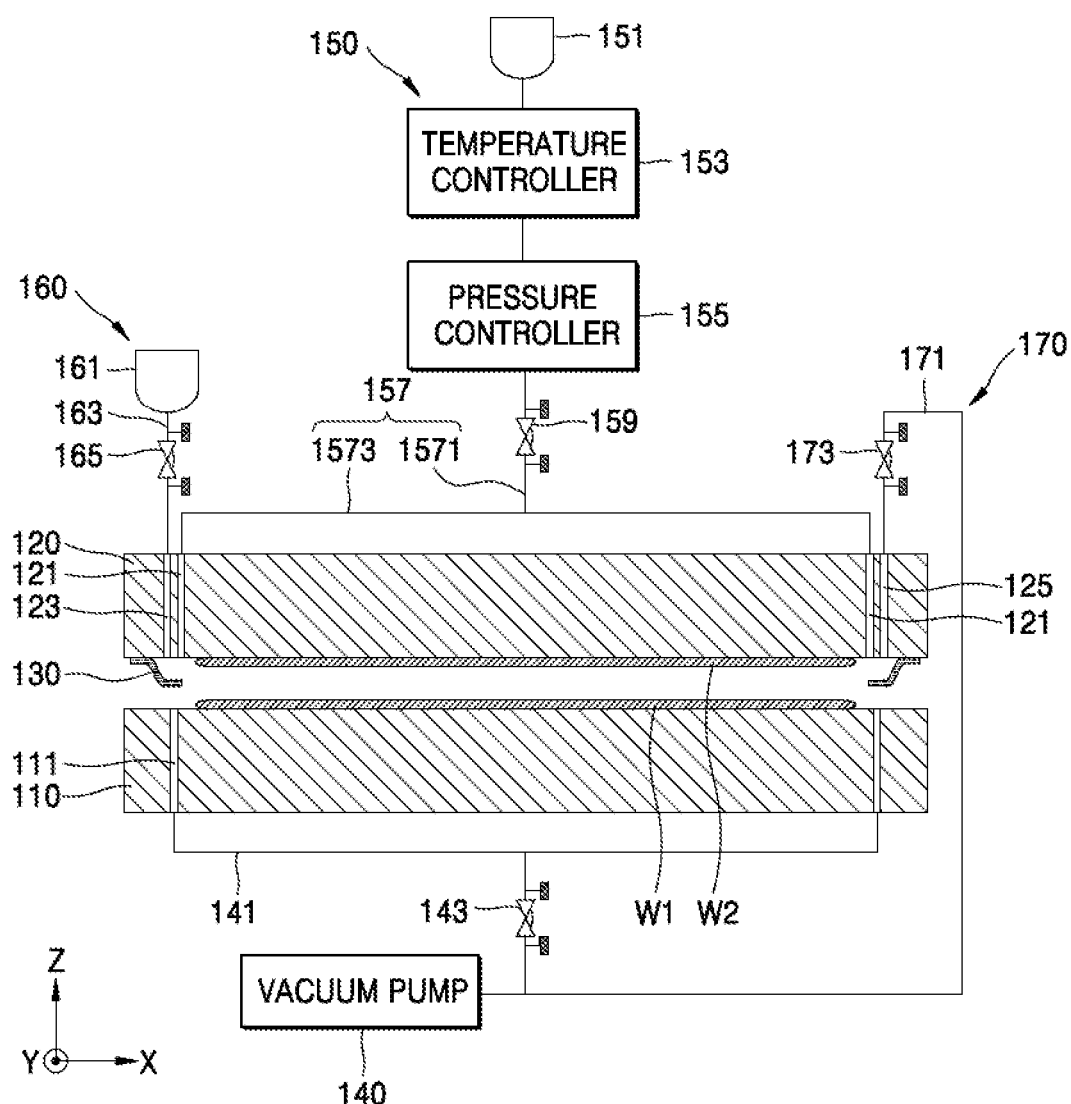
FIGS. 8A to 8G are conceptual diagrams illustrating sequential processes of a substrate bonding method according to example embodiments of the inventive concept.

Referring to FIGS. 7 and 8A, the second bonding chuck 120 is aligned with the first bonding chuck 110, such that the second bonding chuck 120 is arranged over the first bonding chuck 110 (S110). The second bonding chuck 120 is arranged on the second substrate W2. The first bonding chuck 110 is arranged on the first substrate W1.

For example, the first bonding chuck 110 may hold the first substrate W1 by vacuum suction such that the first substrate W1 is held thereto. The second bonding chuck 120 may hold the second substrate W2 by vacuum suction such that the second substrate W2 is held thereto. The first substrate W1 may be mounted on the first bonding chuck 110 such that an inactive surface of the first substrate W1 contacts the first bonding chuck 110. The second substrate W2 may be mounted on the second bonding chuck 120 such that an inactive surface of the second substrate W2 contacts the second bonding chuck 120. The second bonding surface of the second substrate W2 mounted on the second bonding chuck 120 may face the first bonding surface of the first substrate W1 mounted on the first bonding chuck 110.

The first bonding chuck 110 may be aligned with the second bonding chuck 120 in a vertical direction (for example, a Z-direction). To align the first bonding chuck 110 with the second bonding chuck 120, at least one selected from the first bonding chuck 110 and the second bonding chuck 120 may be moved in the horizontal direction (for example, the X-direction and/or the Y-direction) and may also be rotated about an axis corresponding to the vertical direction (for example, the Z-direction).

Figure 8B:
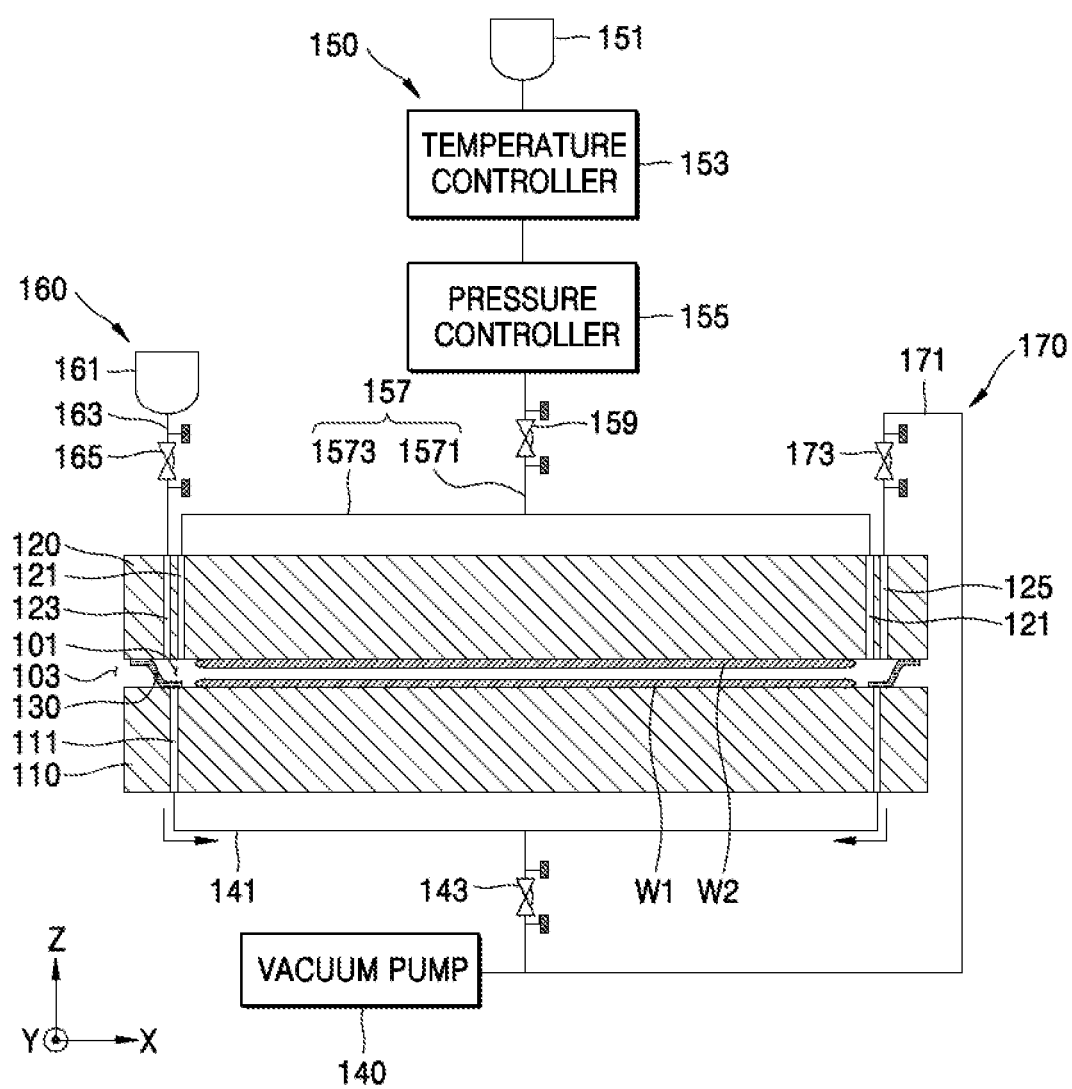

Referring to FIGS. 7 and 8B, the first substrate W1 and the second substrate W2 are located close to each other by moving the second bonding chuck 120 in the vertical direction (for example, the Z-direction). The seal 130 surrounding both the edge of the first substrate W1 and the edge of the second substrate W2 is secured between the first bonding chuck 110 and the second bonding chuck 120, thereby forming the bonding space 101 which is between the first bonding chuck 110 and the second bonding chuck 120 and is sealed by the seal 130 (S120).

The second bonding chuck 120 may be lowered such that the first bonding surface of the first substrate W1 is apart from the second bonding surface of the second substrate W2 by as much as a pre-set suitable distance. For example, the distance between the first bonding surface of the first substrate W1 and the second bonding surface of the second substrate W2 may be about 10 μm to about 200 μm. Of course, to adjust the distance between the first substrate W1 and the second substrate W2, the first bonding chuck 110 may be raised up, or the raising of the first bonding chuck 110 and the lowering of the second bonding chuck 120 may be simultaneously performed.

During the lowering of the second bonding chuck 120, the seal 130 coupled to the second bonding chuck 120 may be lowered together with the second bonding chuck 120. When the first substrate W1 is apart from the second substrate W2 by as much as the pre-set suitable distance through the lowering of the second bonding chuck 120, the vacuum pump 140 provide a vacuum pressure in the vacuum groove 111 of the first bonding chuck 110, thereby coupling the lower portion of the seal 130 to the first bonding chuck 110. As the lower portion of the seal 130 is coupled to the first bonding chuck 110, the bonding space 101 surrounded by the seal 130 may be defined.

Figure 8C:
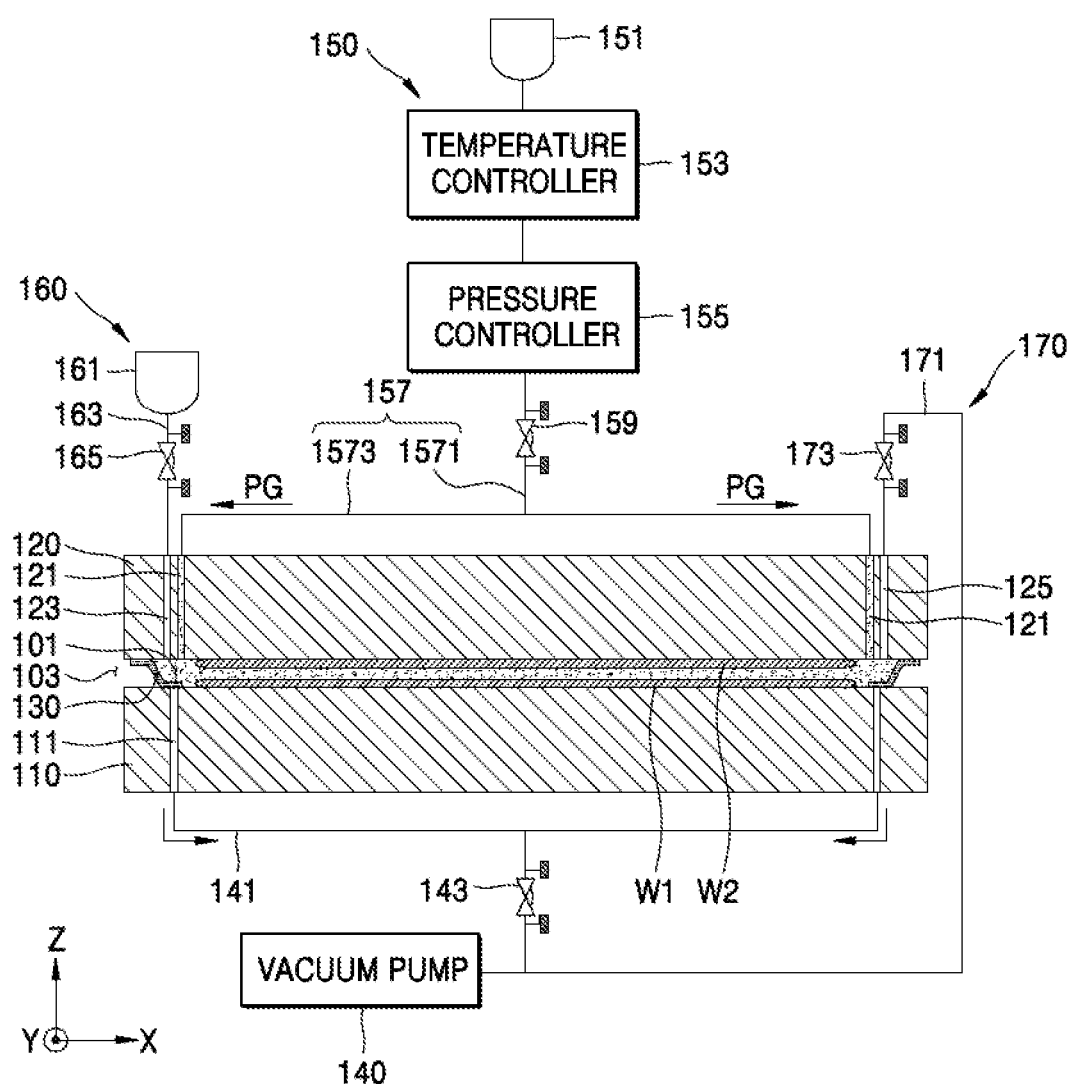

Referring to FIGS. 7 and 8C, a process gas PG is supplied to the bonding space 101 (S130).

For example, the process gas supply device 150 may fill the bonding space 101 with helium (He) gas by supplying helium (He) gas through the process gas supply hole 121 of the second bonding chuck 120. Here, for the bonding space 101 to have a pre-set temperature and a pre-set pressure, as described with reference to FIG. 3, the feedback temperature control may be performed based on the temperature of the bonding space 101, which is sensed by the temperature sensor 181, and the feedback pressure control may be performed based on the pressure of the bonding space 101, which is sensed by the pressure sensor 183.

In example embodiments, for the bonding space 101 to have a pre-set temperature, the temperature of the process gas PG supplied to the bonding space 101 may be adjusted. For example, as described with reference to FIG. 3, the temperature sensor 181 may sense the temperature of the bonding space 101. Additionally, when the controller 190 determines that the temperature of the bonding space 101, which is sensed by the temperature sensor 181, is outside the pre-set target temperature range (for example, a range of about 15° C. to about 25° C.), the controller 190 may control the operations of the temperature controller 153. Therefore, the controller 190 may adjust the temperature of the process gas PG supplied to the bonding space 101.

Additionally, in example embodiments, for the bonding space 101 to have a pre-set pressure, the pressure of the process gas PG supplied to the bonding space 101 may be adjusted. For example, as described with reference to FIG. 3, the pressure sensor 183 may sense the pressure of the bonding space 101. When the controller 190 determines that the pressure of the bonding space 101, which is sensed by the pressure sensor 183, is outside the pre-set target pressure range (for example, a range of about 1 atm to about 1.5 atm), the controller 190 may control the operations of the pressure controller 155. Therefore, the controller 190 may adjust the pressure of the process gas PG supplied to the bonding space 101.

When the bonding space 101 has a pre-set temperature and a pre-set pressure by supplying the process gas PG to the bonding space 101, the first substrate W1 is bonded to the second substrate W2. The bonding between the first substrate W1 and the second substrate W2 may include, for example, operation S140 of bringing the first substrate W1 and the second substrate W2 into contact with each other at one contact point and operation S150 of propagating the bonding area between the first substrate W1 and the second substrate W2.

Figure 8D:
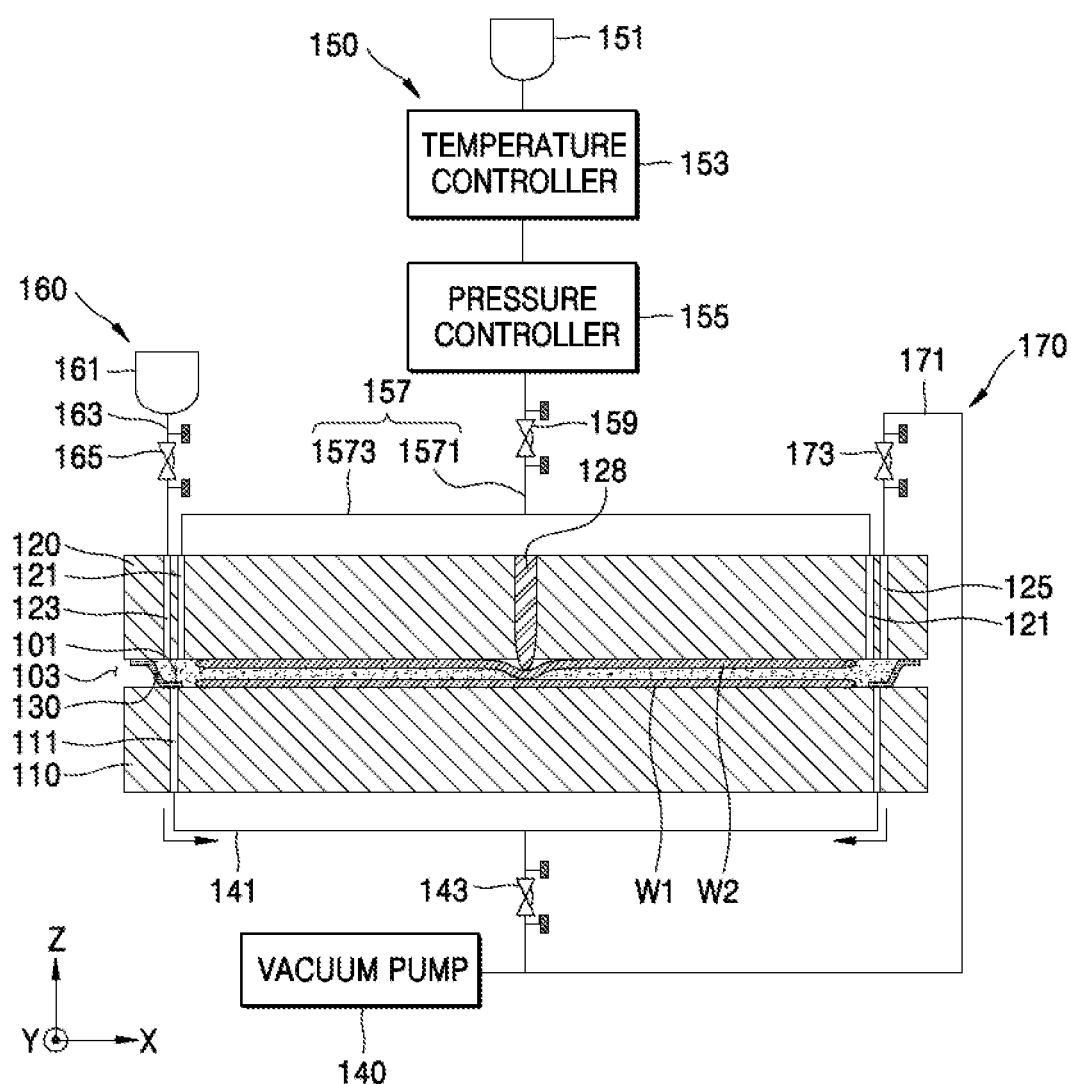

Referring to FIGS. 7 and 8D, the first substrate W1 and the second substrate W2 are brought into contact with each other at one contact point (S140) to initiate the bonding between the first substrate W1 and the second substrate W2.

For example, the second bonding chuck 120 may push the center of the second substrate W2 toward the first substrate W1 by using a pressurizing bonding pin 128. The pressurizing bonding pin 128 is a member mounted in a central portion of the second bonding chuck 120 to be reciprocally movable in the vertical direction, and the illustration of the pressurizing bonding pin 128 is omitted from figures other than FIG. 8D, for simplicity of illustration.

In operation S140, the second bonding chuck 120 may release the vacuum suction of a central region of the second substrate W2 and may hold the outer region of the second substrate W2 by vacuum suction. As the pressurizing bonding pin 128 pressurizes the center of the second substrate W2, the center of the second substrate W2 may be brought into contact with the first substrate W1 at one contact point. The one contact point may be defined as a bonding initiation point at which the bonding between the first substrate W1 and the second substrate W2 starts. For example, the bonding initiation point may be a point at which the center of the first bonding surface of the first substrate W1 meets the center of the second bonding surface of the second substrate W2.

Figure 8E:
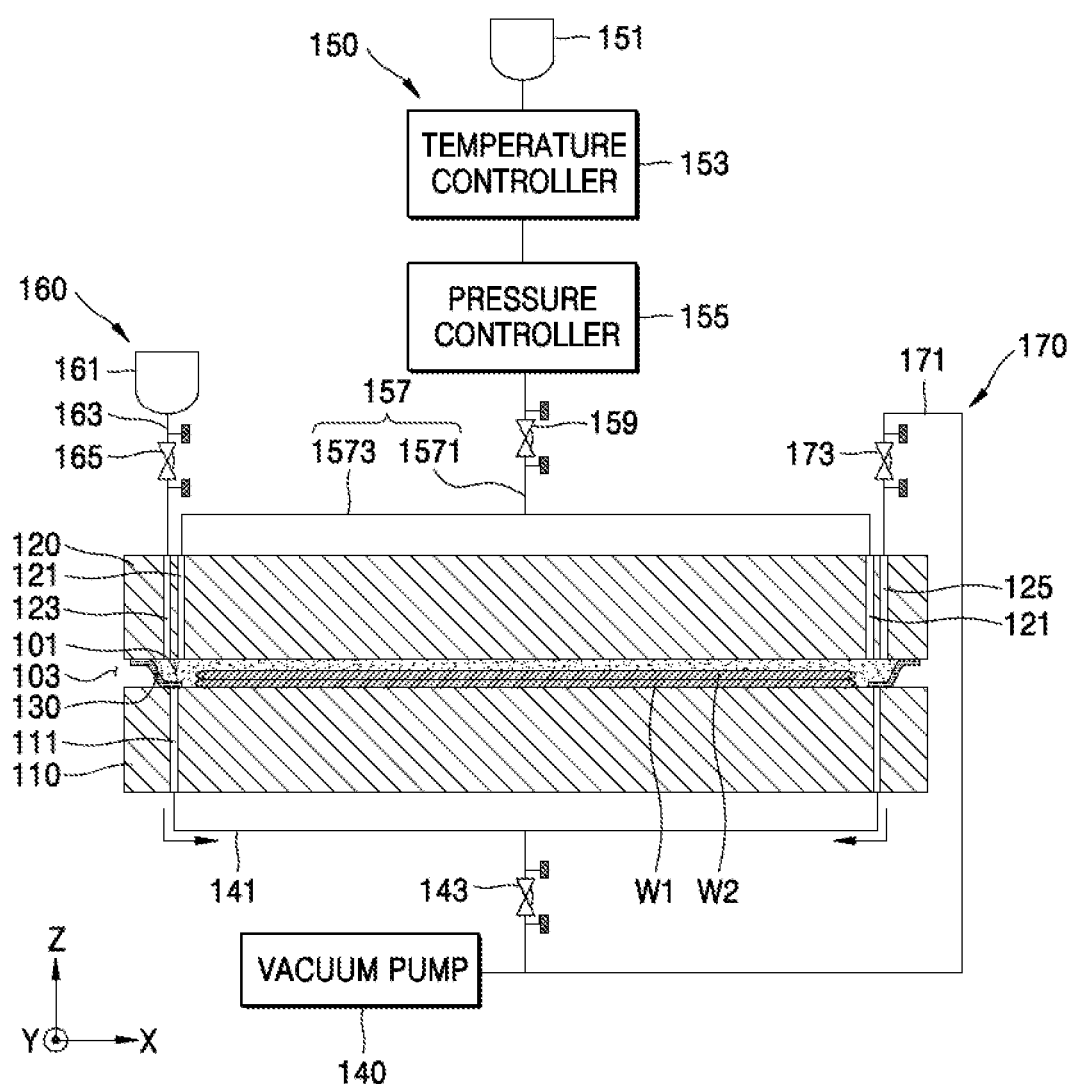

Referring to FIGS. 7 and 8E, the bonding area between the first substrate W1 and the second substrate W2 is propagated from the bonding initiation point toward the outer region of each substrate (S150) after the first substrate W1 and the second substrate W2 are brought into contact with each other at the bonding initiation point.

For example, the propagation of the bonding area between the first substrate W1 and the second substrate W2 may be spontaneously performed even without applying other external force when the second bonding chuck 120 releases the vacuum suction of the outer region of the second substrate W2. A bonded substrate, in which the first substrate W1 and the second substrate W2 are bonded to each other, may be formed when the bonding between the outer region of the first substrate W1 and the outer region of the second substrate W2 is completed.

In example embodiments, a bonding surface of each of the first substrate W1 and the second substrate W2 may be a surface with undergone plasma treatment or wet treatment. For example, each of the first bonding surface of the first substrate W1 and the second bonding surface of the second substrate W2 may have an —OH functional group. Therefore, the —OH functional group of the first bonding surface of the first substrate W1 may be spontaneously bonded to the —OH functional group of the second bonding surface of the second substrate W2 via a hydrogen bond during the bonding between the first substrate W1 and the second substrate W2.

Figure 8F:
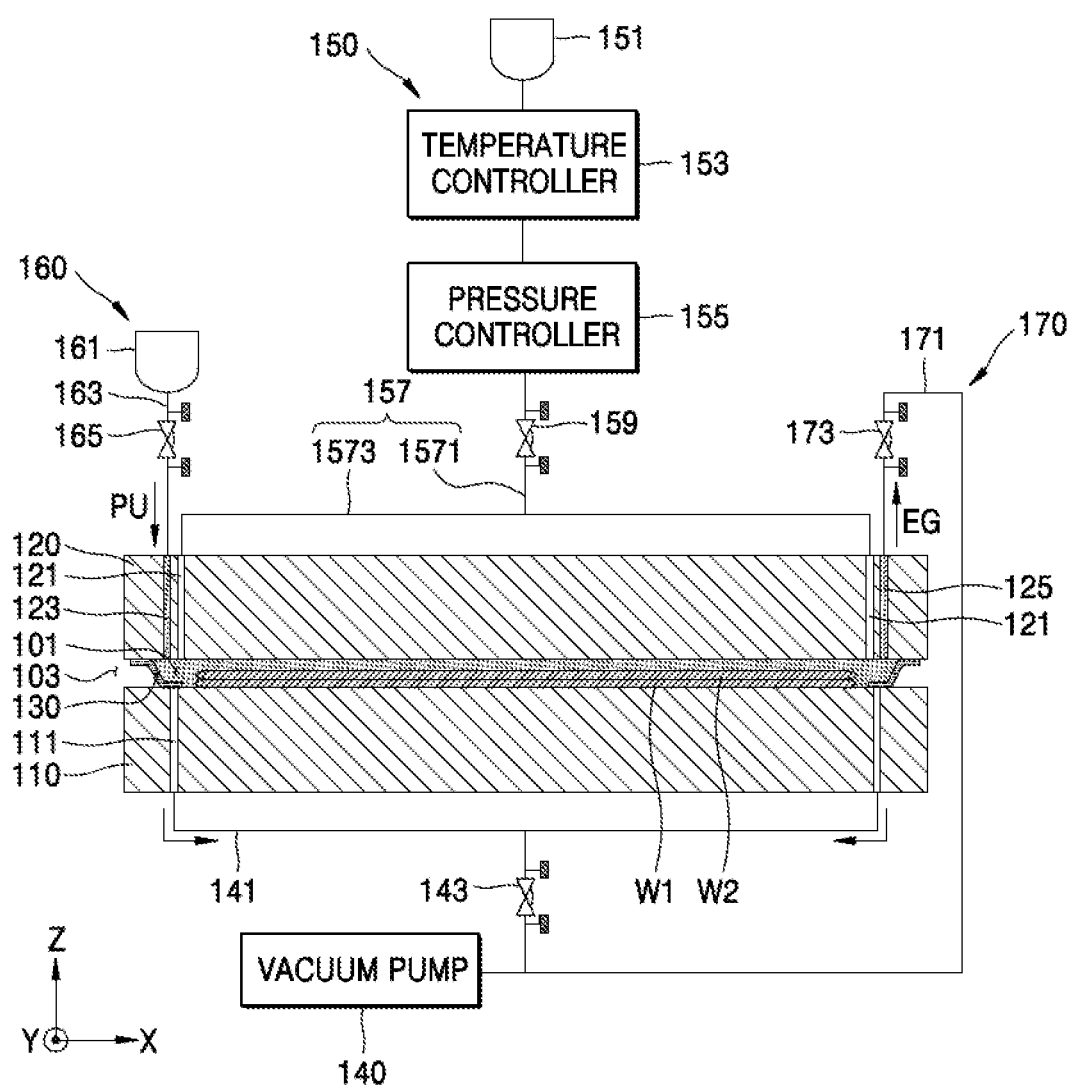

Referring to FIGS. 7 and 8F, when the bonding between the first substrate W1 and the second substrate W2 is completed, the process gas in the bonding space 101 is discharged and a purge gas PU is supplied to the bonding space 101 (S160).

The exhaust device 170 may discharge gas EG from the bonding space 101 through the exhaust hole 125 of the second bonding chuck 120. The purge gas supply device 160 may supply the purge gas PU to the bonding space 101 through the purge gas supply hole 123 of the second bonding chuck 120. The bonding space 101 may be defined by the seal 130. For example, the purge gas supply device 160 may fill the bonding space 101 with the purge gas PU, such as nitrogen ($N_2$) gas. The bonding space 101 defined by the seal 130 may have atmospheric pressure or a pressure close thereto due to the filled purge gas PU.

Figure 8G:
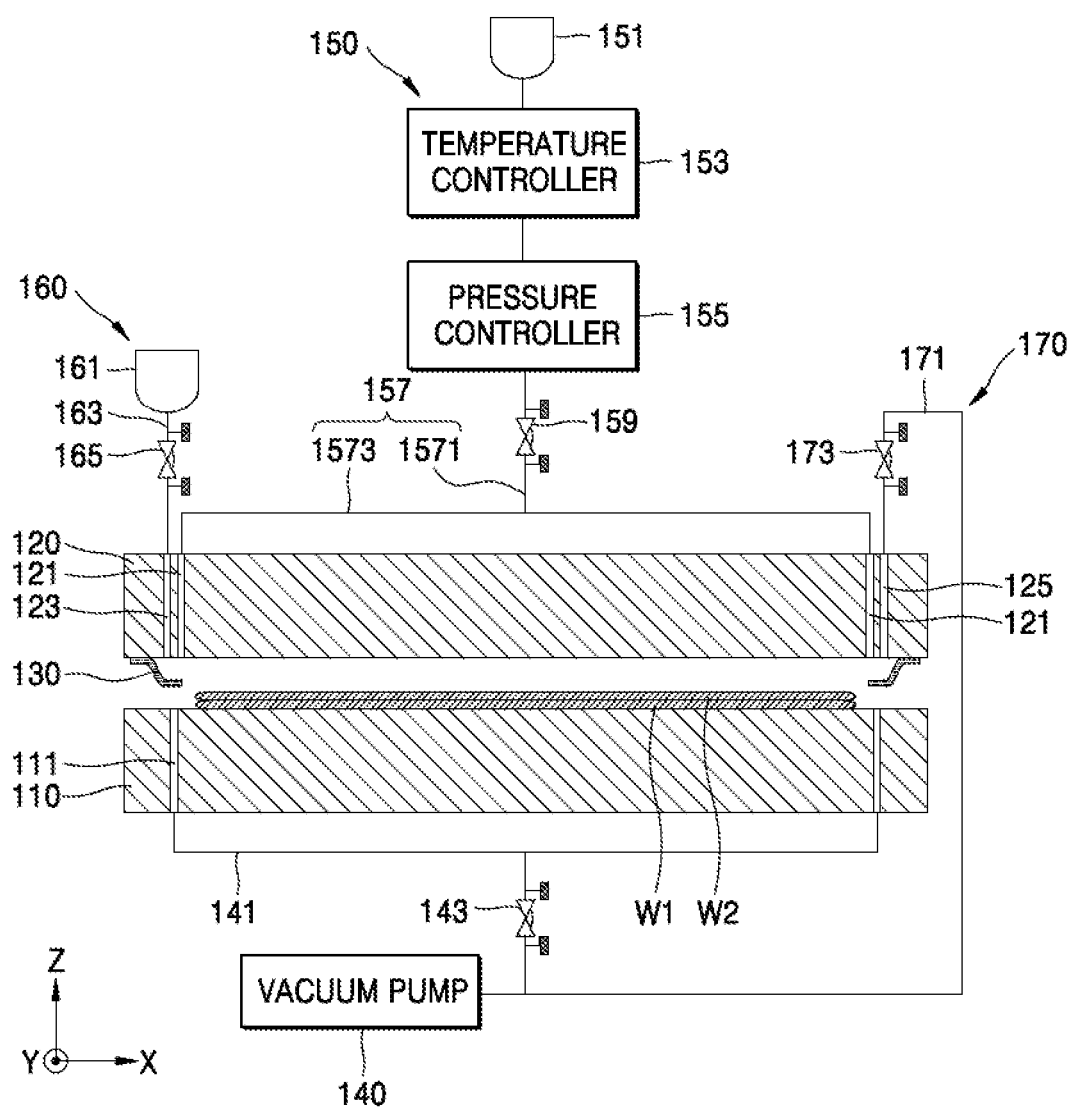

Referring to FIGS. 7 and 8G, the vacuum suction of the seal 130 is released and the first bonding chuck 110 is decoupled from the second bonding chuck 120 (S170).

The vacuum pump 140 may release the vacuum pressure formed in the vacuum groove 111 of the first bonding chuck 110 such that the seal 130 is detachable from the first bonding chuck 110. Additionally, the second bonding chuck 120 may be raised up away from the first bonding chuck 110. After the second bonding chuck 120 is raised up, the bonded substrate obtained by bonding the first substrate W1 to the second substrate W2 may be unloaded.

Thus, according to embodiments of the inventive concept, a method of manufacturing a semiconductor device includes providing a first substrate W1 disposed on a first bonding chuck 110 and a second substrate W2 disposed on a second bonding chuck 120, wherein the first substrate W1 and the second substrate W2 are located between the first bonding chuck 110 and the second bonding chuck 120; providing a seal 130 in direct contact with the first bonding chuck 110 and the second bonding chuck 120 to enclose a bonding space 101 between the first bonding chuck 110 and the second bonding chuck 120; supplying a process gas to the bonding space 101, the process gas having less reactivity with the first substrate W1 and the second substrate W2 compared with ambient gas outside the bonding space 101; and bonding the first substrate W1 to the second substrate W2. In some cases, a purge gas may be supplied to the bonding space 101 after bonding the first substrate W1 to the second substrate W2 to discharge the process gas from the bonding space 101.

Figure 9:
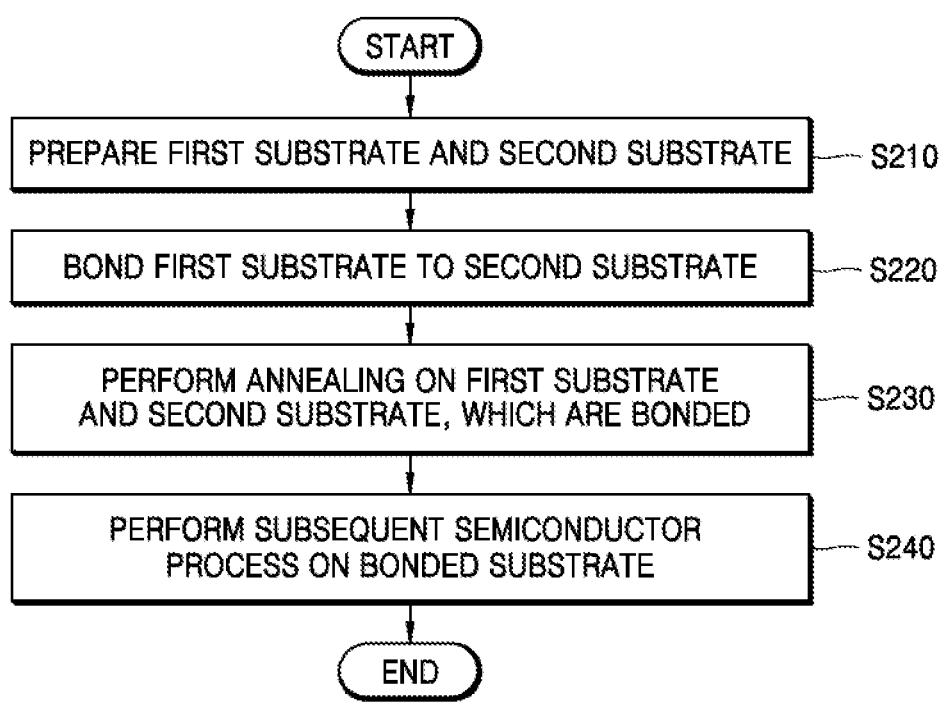
FIG. 9 is a flowchart illustrating a method of manufacturing a semiconductor device, according to example embodiments of the inventive concept.
Figure 10A:
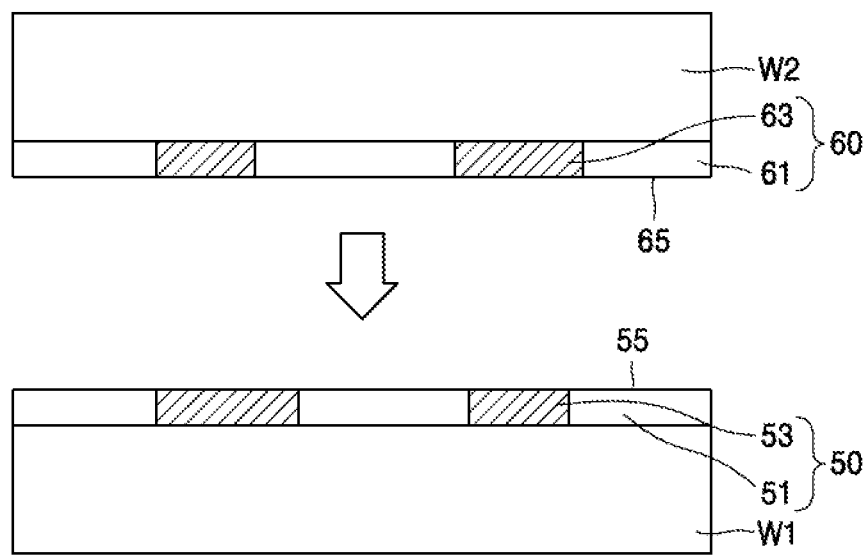
FIGS. 10A and 10B are cross-sectional views illustrating sequential processes of bonding a first substrate to a second substrate.
Figure 10B:
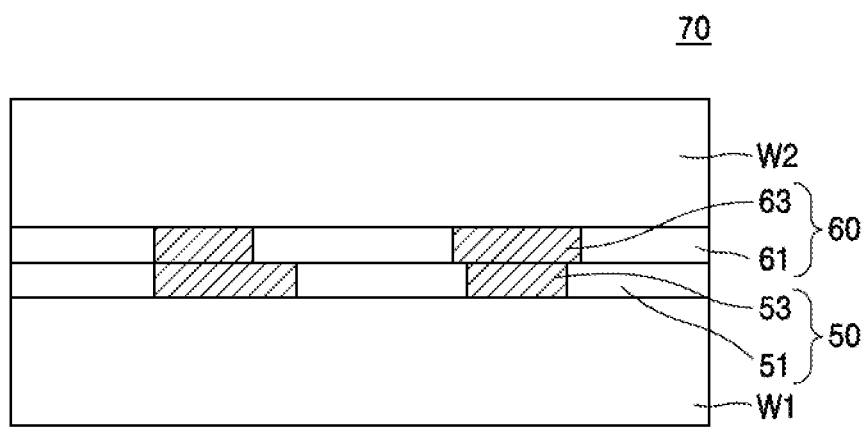

FIG. 9 is a flowchart illustrating a method of manufacturing a semiconductor device, according to example embodiments of the inventive concept. FIGS. 10A and 10B are cross-sectional views illustrating sequential processes of bonding the first substrate W1 to the second substrate W2. Hereinafter, the method of manufacturing a semiconductor device, according to example embodiments of the inventive concept, will be described with reference to FIGS. 9, 10A, and 10B.

Referring to FIGS. 9 and 10A, the first substrate W1 and the second substrate W2, which are targeted by being bonded, are prepared (S210).

Each of the first and second substrates W1 and W2 may have an active surface, on which a semiconductor structure is formed and an inactive surface opposite the active surface. The active surface corresponds to a frontside surface of each of the first and second substrates W1 and W2. The inactive surface corresponds to a backside surface of each of the first and second substrates W1 and W2. In example embodiments, the first substrate W1 may include a first semiconductor structure 50 formed on the active surface thereof. Additionally, the second substrate W2 may include a second semiconductor structure 60 formed on the active surface thereof.

For example, each of the first and second substrates W1 and W2 may include silicon. Alternatively, each of the first and second substrates W1 and W2 may include a semiconductor element such as germanium or a compound semiconductor such as silicon carbide (SiC), gallium arsenide (GaAs), indium arsenide (InAs), or indium phosphide (InP).

For example, the first semiconductor structure 50 may include a first insulating layer 51 and a first conductive pattern 53. The second semiconductor structure 60 may include a second insulating layer 61 and a second conductive pattern 63. Each of the first insulating layer 51 and the second insulating layer 61 may include, for example, silicon oxide. Each of the first conductive pattern 53 and the second conductive pattern 63 may include, for example, copper (Cu). Additionally, in example embodiments, each of the first semiconductor structures 50 and second semiconductor structures 60 may include a semiconductor device layer. The semiconductor device layer constitutes a plurality of individual devices and a wiring structure layer for electrically connecting the plurality of individual devices to each other.

Each of the plurality of individual devices may include volatile memory and/or nonvolatile memory. For example, the volatile memory may include dynamic random access memory (DRAM), static RAM (SRAM), or the like. The nonvolatile memory may include, for example, flash memory, magnetic RAM (MRAM), phase-change RAM (PRAM), or the like. Alternatively, each of the first and second substrates W1 and W2 may include a logic chip, a system-on-chip (SOC), an application-specific integrated circuit (ASIC), an image sensor chip, or the like. The wiring structure layer may include a metal wiring layer and/or a via plug. For example, the wiring structure layer may have a multilayer structure in which two or more metal wiring layers and/or two or more via plugs are alternately stacked.

In example embodiments, the first substrate W1 may be a wafer including a logic chip and the second substrate W2 may be a wafer including a memory chip. Alternatively, the first substrate W1 may be a wafer including a logic chip and the second substrate W2 may be a wafer including an image sensor chip.

Referring to FIGS. 9, a process is described in which the first substrate W1 is bonded to the second substrate W2 (S220). FIG. 10A shows the first substrate W1 and the second substrate W2 prior to bonding and FIG. 10B shows the first substrate W1 and the second substrate W2 after bonding.

The first bonding chuck 110 (see FIG. 1) and the second bonding chuck 120 (see FIG. 1) undergo align-bonding, thereby bonding the first substrate W1 to the second substrate W2. When the first substrate W1 is bonded to the second substrate W2, a surface 55 of the first semiconductor structure 50 contacts a surface 65 of the second semiconductor structure 60. Additionally, the first conductive pattern 53 of the first semiconductor structure 50 contacts the second conductive pattern 63 of the second semiconductor structure 60. For example, the bonding between the first substrate W1 and the second substrate W2 may be performed by using the substrate bonding apparatus 100, 100a, or 100b described above and may also be performed by the substrate bonding method described with reference to FIGS. 7 and 8A to 8G.

Referring to FIG. 9, when the bonding between the first substrate W1 and the second substrate W2 by using the substrate bonding apparatus 100 is completed, the first substrate W1 and the second substrate W2, which are bonded to each other, undergo annealing to increase bonding strength between the first substrate W1 and the second substrate W2 (S230).

Referring to the annealing process, the first conductive pattern 53 of the first semiconductor structure 50 may be more firmly bonded to the second conductive pattern 63 of the second semiconductor structure 60. Additionally, the first insulating layer 51 of the first semiconductor structure 50 may be more firmly bonded to the second insulating layer 61 of the second semiconductor structure 60.

Referring to FIG. 9, a bonded substrate 70 obtained by bonding the first substrate W1 to the second substrate W2 undergoes a subsequent semiconductor process (S240).

The subsequent semiconductor process may include various processes. For example, the subsequent semiconductor process may include a deposition process, an etching process, an ion process, a cleaning process, or the like. Here, the deposition process may include various material layer forming processes such as chemical vapor deposition (CVD), sputtering, spin coating, and the like. The ion process may include processes such as ion implantation, diffusion, annealing, and the like. By performing these subsequent semiconductor processes, an integrated circuit and wiring lines, which constitute a semiconductor device, may be formed.

The subsequent semiconductor process may include a packaging process in which the semiconductor device is mounted on a printed circuit board and a molding layer is formed. Additionally, the subsequent semiconductor process may include a test process in which the semiconductor device or a semiconductor package is tested. By performing these subsequent semiconductor processes, the semiconductor device or the semiconductor package may be completed.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    aligning a second bonding chuck, on which a second substrate is arranged, with a first bonding chuck, on which a first substrate is arranged, such that the second bonding chuck is arranged over the first bonding chuck;
    forming a bonding space between the first bonding chuck and the second bonding chuck by securing a seal between the first bonding chuck and the second bonding chuck, the bonding space being surrounded by the seal, and the seal surrounding an edge of the first substrate and an edge of the second substrate;
    supplying a process gas to the bonding space; and
    bonding the first substrate to the second substrate.

2. The method of claim 1, wherein
    an upper portion of the seal is coupled to the second bonding chuck,
    a lower portion of the seal is detachably coupled to the first bonding chuck, and
    the lower portion of the seal is coupled to the first bonding chuck by a vacuum pressure applied to a vacuum groove arranged in the first bonding chuck.

3. The method of claim 1, wherein
    the supplying of the process gas to the bonding space comprises:
    sensing a temperature of the bonding space; and,
    when the sensed temperature of the bonding space is outside a pre-set target temperature range, adjusting a temperature of the process gas supplied to the bonding space.

4. The method of claim 3, wherein the target temperature range is from about 15° C. to about 25° C.

5. The method of claim 1, wherein
    the supplying of the process gas to the bonding space comprises:
    sensing a pressure of the bonding space; and,
    when the sensed pressure of the bonding space is outside a pre-set target pressure range, adjusting a pressure of the process gas supplied to the bonding space.

6. The method of claim 5, wherein the target pressure range is from about 1 atm to about 1.5 atm.

7. The method of claim 1, further comprising
    after the bonding of the first substrate to the second substrate, discharging gas from the bonding space surrounded by the seal and supplying a purge gas to the bonding space.

8. The method of claim 1, wherein the process gas is helium (He) gas.

9. A method of manufacturing a semiconductor device, the method comprising:
    providing a first substrate disposed on a first bonding chuck and a second substrate disposed on a second bonding chuck, wherein the first substrate and the second substrate are located between the first bonding chuck and the second bonding chuck;
    providing a seal in direct contact with the first bonding chuck and the second bonding chuck to enclose a bonding space between the first bonding chuck and the second bonding chuck;
    supplying a process gas to the bonding space, the process gas having less reactivity with the first substrate and the second substrate compared with ambient gas outside the bonding space; and
    bonding the first substrate to the second substrate.

10. The method of claim 9, further comprising:
    supplying a purge gas to the bonding space after bonding the first substrate to the second substrate to discharge the process gas from the bonding space.

* * * * *